(12) United States Patent
Hashimoto

(10) Patent No.: US 7,470,979 B2
(45) Date of Patent: *Dec. 30, 2008

(54) ELECTRONIC COMPONENT AND SEMICONDUCTOR DEVICE, METHOD OF MAKING THE SAME AND METHOD OF MOUNTING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 53 days.

This patent is subject to a terminal disclaimer.

(21) Appl. No.: 11/320,583

(22) Filed: Dec. 30, 2005

(65) Prior Publication Data

US 2006/0131705 A1 Jun. 22, 2006

Related U.S. Application Data

(60) Continuation of application No. 10/804,039, filed on Mar. 19, 2004, now Pat. No. 7,049,686, which is a continuation of application No. 10/254,600, filed on Sep. 26, 2002, now Pat. No. 6,730,589, which is a division of application No. 09/117,510, filed as application No. PCT/JP97/04437 on Dec. 4, 1997, now Pat. No. 6,475,896.

(30) Foreign Application Priority Data

Dec. 4, 1996 (JP) .................. 8-339045
Dec. 26, 1996 (JP) .................. 8-356880
Mar. 26, 1997 (JP) .................. 9-91449

(51) Int. Cl.
*H01L 23/02* (2006.01)

(52) U.S. Cl. .................. 257/669; 257/178; 257/737; 257/E23.021; 257/E23.069

(58) Field of Classification Search .................. 257/706, 257/737, 738, 178, 669
See application file for complete search history.

(56) References Cited

U.S. PATENT DOCUMENTS 3,846,166 A * 11/1974 Saiki et al. .................. 438/656
4,076,575 A 2/1978 Chang
4,698,125 A 10/1987 Rhodes (Continued)

FOREIGN PATENT DOCUMENTS

CN 1123468 A 5/1996

(Continued)

*Primary Examiner*—Long K Tran
(74) *Attorney, Agent, or Firm*—Oliff & Berridge, PLC

(57) ABSTRACT

A semiconductor device with its package size close to its chip size has a stress absorbing layer, allows a patterned flexible substrate to be omitted, and allows a plurality of components to be fabricated simultaneously. There is: a step of forming electrodes (12) on a wafer (10); a step of providing a resin layer (14) as a stress relieving layer on the wafer (10), avoiding the electrodes (12); a step of forming a chromium layer (16) as wiring from electrodes (12) over the resin layer (14); a step of forming solder balls as external electrodes on the chromium layer (16) over the resin layer (14); and a step of cutting the wafer (10) into individual semiconductor chips; in the steps of forming the chromium layer (16) and solder balls, metal, thin film fabrication technology is used during the wafer process.

10 Claims, 23 Drawing Sheets

U.S. PATENT DOCUMENTS

| | | | |
|---|---|---|---|
| 4,917,466 A | 4/1990 | Nakamura et al. | |
| 4,948,754 A | 8/1990 | Kondo et al. | |
| 5,010,389 A | 4/1991 | Gansauge et al. | |
| 5,111,278 A | 5/1992 | Eichelberger | |
| 5,128,746 A | 7/1992 | Pennisi et al. | |
| 5,171,711 A | 12/1992 | Tobimatsu | |
| 5,180,691 A | 1/1993 | Adachi et al. | |
| 5,498,572 A | 3/1996 | Shiga et al. | |
| 5,604,379 A | 2/1997 | Mori | |
| 5,614,765 A | 3/1997 | Avanzino et al. | |
| 5,641,113 A | 6/1997 | Somaki et al. | |
| 5,659,952 A | 8/1997 | Kovac et al. | |
| 5,672,548 A * | 9/1997 | Culnane et al. | 438/118 |
| 5,677,576 A * | 10/1997 | Akagawa | 257/785 |
| 5,678,287 A | 10/1997 | Smith et al. | |
| 5,739,588 A | 4/1998 | Ishida et al. | |
| 5,744,382 A | 4/1998 | Kitayama et al. | |
| 5,744,863 A | 4/1998 | Culnane et al. | |
| 5,773,359 A | 6/1998 | Mitchell et al. | |
| 5,785,799 A | 7/1998 | Culnane et al. | |
| 5,834,844 A | 11/1998 | Akagawa et al. | |
| 5,960,308 A | 9/1999 | Akagawa et al. | |
| 5,989,939 A | 11/1999 | Fjelstad | |
| 6,049,120 A | 4/2000 | Otani et al. | |
| 6,403,882 B1 * | 6/2002 | Chen et al. | 174/565 |

FOREIGN PATENT DOCUMENTS

| | | |
|---|---|---|
| CN | 1132003 A | 9/1996 |
| EP | 1 030 357 A1 | 8/2000 |
| GB | A-2-027-272 | 2/1980 |
| JP | 52-8785 | 1/1977 |
| JP | A-55-018069 | 2/1980 |
| JP | A-59-188153 | 10/1984 |
| JP | A-61-253826 | 11/1986 |
| JP | A-61-294838 | 12/1986 |
| JP | A 63-72143 | 4/1988 |
| JP | 63-229839 | 9/1988 |
| JP | A-63-307759 | 12/1988 |
| JP | 64-1257 | 1/1989 |
| JP | A 64-1257 | 1/1989 |
| JP | A-01-108745 | 4/1989 |
| JP | 1-196856 | 8/1989 |
| JP | A-01-209746 | 8/1989 |
| JP | A 2-63127 | 3/1990 |
| JP | 2-109358 | 4/1990 |
| JP | A-2-130828 | 5/1990 |
| JP | 3-20041 | 1/1991 |
| JP | U-03-023928 | 3/1991 |
| JP | 3-198342 | 8/1991 |
| JP | A-3-198342 | 8/1991 |
| JP | 4-10429 | 1/1992 |
| JP | 04-028231 A | 1/1992 |
| JP | A 4-10429 | 1/1992 |
| JP | 4-74427 | 6/1992 |
| JP | A-04-313256 | 11/1992 |
| JP | A-4-346231 | 12/1992 |
| JP | A-5-55533 | 3/1993 |
| JP | A-5-74770 | 3/1993 |
| JP | A-5-82518 | 4/1993 |
| JP | A 5-226416 | 9/1993 |
| JP | A-5-267474 | 10/1993 |
| JP | A 5-291262 | 11/1993 |
| JP | A-05-315445 | 11/1993 |
| JP | A-6-13468 | 1/1994 |
| JP | A-6-21061 | 1/1994 |
| JP | 6-69211 | 3/1994 |
| JP | 6-77283 | 3/1994 |
| JP | A-7-169835 | 7/1995 |
| JP | A 7-297236 | 11/1995 |
| JP | A-08-031872 | 2/1996 |
| JP | A-08-097217 | 4/1996 |
| JP | A 8-102466 | 4/1996 |
| JP | A-08-172114 | 7/1996 |
| JP | 8-203906 | 8/1996 |
| JP | 8-250549 | 9/1996 |

* cited by examiner

ELECTRONIC COMPONENT AND SEMICONDUCTOR DEVICE, METHOD OF MAKING THE SAME AND METHOD OF MOUNTING THE SAME, CIRCUIT BOARD, AND ELECTRONIC INSTRUMENT

This is a Continuation of application Ser. No. 10/804,039, filed Mar. 19, 2004, which in turn is a continuation of application Ser. No. 10/254,600, filed Sep. 26, 2002, now U.S. Pat. No. 6,730,589, which in turn is a divisional of application Ser. No. 09/117,510, filed Apr. 22, 1999, now U.S. Pat. No. 6,475,896, which claims the benefit of PCT/JP97/04437, filed Dec. 4, 1997. The entire disclosure of the prior applications is hereby incorporated by reference herein in its entirety.

BACKGROUND

The invention relates to an electronic component and a semiconductor device, a method of making the same and method of mounting the same, a circuit board, and an electronic instrument, and in particular relates to a compact electronic component and a semiconductor device having a package size close to the chip size, a method of making the same and method of mounting the same, a circuit board, and an electronic instrument.

To pursue high-density mounting in semiconductor devices, bare chip mounting is the ideal. However, for bare chips, quality control and handling are difficult. In answer to this, CSP (chip scale package), or packages whose size is close to that of the chip, have been developed.

Of the forms of CSP semiconductor device developed, one form has a flexible substrate provided, patterned on the active surface of the semiconductor chip, and on this flexible substrate are formed a plurality of external electrodes. It is also known to inject a resin between the active surface of the semiconductor chip and the flexible substrate, in order to absorb the thermal stress. In Japanese Patent Application Laid-Open No. 7-297236, as the flexible substrate is described the use of a thin film carrier tape.

In these methods of fabricating a semiconductor device, a semiconductor chip is cut from a wafer, and individual semiconductor chips are mounted on a flexible substrate. As a result, not only is the patterned flexible substrate necessary, but also a process is required to mount each individual semiconductor chip on the flexible substrate, and therefore the devices used in each of the steps of the process must be special-purpose equipments, and the cost is increased.

Besides, a semiconductor device to which a CSP type package is applied is surface-mounted, and has a plurality of bumps for mounting on a circuit board. The surface on which these bumps are formed is preferably protected by the provision, for example, of a photosensitive resin.

However, since a photosensitive resin is electrically insulating, and mounting while it remains on the bumps is not possible, it is necessary to remove the photosensitive resin from the top of the bumps. Here, in order to remove a part of the photosensitive resin, lithography must be applied, and this results in the problem of an increased number of steps.

In this way, a conventional semiconductor device suffers from inferior efficiency in the process from fabrication to mounting.

The invention has as its object the solution of the above described problems, and this object subsists in the provision of an electronic component and a semiconductor device, a method of making the same and method of mounting the same, a circuit board, and an electronic instrument such that the process from fabrication to mounting can be carried out efficiently.

DISCLOSURE OF INVENTION

The method of making a semiconductor device of the invention comprises:
  a step of providing a wafer on which are formed electrodes;
  a step of providing a stress relieving layer on the wafer in such a way as to avoid at least a part of the electrodes;
  a step of forming wiring over the stress relieving layer from the electrodes;
  a step of forming external electrodes connected to the wiring above the stress relieving layer; and
  a step of cutting the wafer into individual pieces.

According to the invention, the stress relieving layer is formed on the wafer, and further thereon the wiring and external electrodes are laminated, so that the fabrication process proceeds as far as forming the semiconductor package while still in the wafer-stage; this obviates the need for a substrate such as a patterned film with preformed external electrodes.

Here, the stress relieving layer refers to a layer which relieves the stress caused by distortion between the motherboard (mounting board) and semiconductor chip. For example, such stresses may be generated when the semiconductor device is mounted on the mounting board and when subsequently heat is applied. As the stress relieving layer is selected a material which is flexible or a gel material.

Besides, since the wiring between the electrodes and the external electrodes can be formed freely according to the requirements of the design, the layout of the external electrodes can be determined regardless of the layout of the electrodes. As a result, without changing the circuit design of the elements formed on the wafer, various semiconductor devices with the external electrodes in different positions can easily be fabricated.

Furthermore, according to the invention, after the stress relieving layer, wiring and external electrodes are formed on the wafer, the wafer is cut, to obtain individual semiconductor devices. As a result, the formation of the stress relieving layer, wiring and external electrodes on a large number of semiconductor devices can be carried out simultaneously, which is preferable when quantity production is considered.

As the stress relieving layer is used, for example, a resin with a Young's modulus of not more than $1 \times 10^{10}$ Pa.

In the step of providing the stress relieving layer, a photosensitive resin may be applied to the wafer in such as way as to include the electrodes, and the photosensitive resin may be removed from the region corresponding to the electrodes, whereby the stress relieving layer may be provided.

The stress relieving layer may be provided by printing the resin constituting the stress relieving layer.

The photosensitive resin may be selected from the set consisting of polyimide resin, silicone resin, and epoxy resin.

The stress relieving layer may have a plate with holes formed corresponding to the electrodes adhered to the wafer; and the plate may have a coefficient of thermal expansion intermediate between those of the semiconductor chip and a circuit board on which the semiconductor chip is mounted.

By this means, since the coefficient of thermal expansion of the plate is intermediate between the coefficient of thermal expansion of the semiconductor chip and the coefficient of thermal expansion of the board, stress generated by differences in the coefficient of thermal expansion values can be absorbed. Besides, since the plate used here simply has holes formed therein, its formation is simpler than that of a patterned substrate.

The stress relieving layer may be formed of a resin in a plate form, and the plate form of resin may be adhered to the wafer.

By this means, in contradistinction to a patterned substrate, the required form can be formed easily.

The wafer used in the step of providing the wafer may have formed an insulating film, except in the regions of the electrodes and the region cut in the step of cutting.

Before the step of forming wiring, there may further be a step of roughening the surface of the stress relieving layer.

After the step of forming external electrodes and before the step of cutting, there may further be a step of applying a photosensitive resin to form a film on the surface of formation of the external electrodes to include the external electrodes, and a step of carrying out isotropic etching with respect to the photosensitive resin until the external electrodes are exposed.

After the step of forming external electrodes and before the step of cutting, there may further be a step of applying an organic film to form a film on the surface of formation of the external electrodes to include the external electrodes.

As the organic film may be used a flux such that when heated the residue is changed by a chemical reaction into a thermoplastic polymer resin.

The wiring may be bent over the stress relieving layer.

At the junction of the wiring and the electrodes, the width of the wiring may be greater than the width of the electrodes.

In the invention, the stress relieving layer may be formed, and over the stress relieving layer the wiring may be formed, and thereafter a solder portion may be formed by electroless plating, and the solder portion may be formed into the external electrodes.

In the invention there may further be:

a step in which the stress relieving layer is formed and a conducting layer is formed on the stress relieving layer; a step in which a solder portion is formed over the conducting layer by electroplating; a step of forming the conducting layer into the wiring; and a step of forming the solder portion into the external electrodes.

In the invention there may further be:

a step in which a protective film is formed over the wiring in a region avoiding the external electrodes.

The solder portion may be formed on a previously formed seat on the wiring.

The solder portion may be formed on a solder film formed by a plating process.

In the invention there may further be:

a step in which after the step of forming the wiring a protective film is formed on the wiring; a step in which before the step of forming external electrodes in at least a part of the region of the protective film corresponding to the external electrodes openings are formed; and in the step of forming external electrodes, a solder cream may be printed in the openings and a wet-back process may be carried out, whereby the external electrodes are formed.

In the invention there may further be:

a step in which after the step of forming wiring, a protective film is formed on the wiring; and a step in which before the step of forming external electrodes in at least a part of the region of the protective film corresponding to the external electrodes openings are formed; and in the step of forming external electrodes, a flux may be applied within the openings, and thereafter on each opening a piece of solder may be mounted, whereby the external electrodes are formed.

The protective film may be formed of a photosensitive resin, and the openings may be formed by a process including exposure and development steps.

In the invention, before the wafer is cut into individual pieces, there may be a step in which a protective member is provided on the surface of the wafer opposite to the surface on which the electrodes are provided.

By this means, since the rear surface of the semiconductor device is covered by a protective film, the occurrence of damage can be prevented.

The method of making a semiconductor device of the invention comprises:
  a step in which a plurality of bumps are formed on one surface of a wafer;
  a step in which resin is applied to the surface until the bumps are included;
  a step in which isotropic dry etching is applied to the face of the resin; and
  a step in which the wafer is cut into individual pieces; and wherein the dry etching step ends after the bumps are exposed and before the surface is exposed.

According to the invention, a resin is applied to one surface of a wafer. This resin is applied over the bumps, but since the bumps project from the surface, the resin is applied more thinly over the bumps than in other regions.

Then when isotropic dry etching is applied to the resin face, since the resin is removed from all regions equally, the bumps where the resin is thinnest are exposed first. At this point the wafer surface is not yet exposed, and the dry etching is stopped at this point. In this way, a wafer can be obtained in which the bumps are exposed, but the regions other than the bumps are protected by a resin covering.

Thereafter, the wafer can be cut into individual pieces to obtain the semiconductor devices.

The method of making an electronic component of the invention comprises:
  a step in which a plurality of electronic elements are integrally formed in substrate form;
  a step in which a stress relieving layer is provided at least in the region where external electrodes are formed on the substrate form electronic elements;
  a step in which the external electrodes are formed on the stress relieving layer; and
  a step in which the substrate form electronic elements are cut into individual items.

According to the invention, since there is a stress absorbing layer, stresses caused by differential thermal expansion between the electronic component and the board on which it is mounted can be absorbed. As electronic components, for example, may be cited resistors, capacitors, coils, oscillators, filters, temperature sensors, thermistors, varistors, variable resistors, fuses, and semiconductor devices.

The method of making an electronic component of the invention comprises:
  a step in which a plurality of bumps are formed on a circuit board mounting surface of an electronic element;
  a step in which resin is applied to the mounting surface until the bumps are included; and
  a step in which isotropic dry etching is applied to the surface of the resin; and wherein the dry etching step ends after the bumps are exposed and before the mounting surface is exposed.

According to the invention, a resin is applied to the mounting surface of an electronic element. This resin is applied over the bumps, but since the bumps project from the mounting surface, the resin is applied more thinly over the bumps than in other regions.

Then when isotropic dry etching is applied to the resin surface, since the resin is removed from all regions equally, the bumps where the resin is thinnest are exposed first. At this point the mounting surface is not yet exposed, and the dry etching is stopped at this point. In this way, an electronic component can be obtained in which the mounting surface is protected by a resin covering, but avoiding the bumps.

In the invention, as the electronic element may be used a semiconductor element.

The method of making an electronic component of the invention comprises:
  a step in which a plurality of bumps are formed on one surface of an electronic element board;
  a step in which resin is applied to the surface until the bumps are included;
  a step in which isotropic dry etching is applied to the face of the resin; and
  a step in which the electronic element board is cut into individual items; and wherein the dry etching step ends after the bumps are exposed and before the mounting surface is exposed.

According to the invention, a resin is applied to one surface of an electronic element board. This resin is applied over the bumps, but since the bumps project from the surface, the resin is applied more thinly over the bumps than in other regions.

Then when isotropic dry etching is applied to the resin surface, since the resin is removed from all regions equally, the bumps where the resin is thinnest are exposed first. At this point the surface of the electronic element board is not yet exposed and the dry etching is stopped at this point. In this way, an electronic element board can be obtained in which the bumps are exposed, but the regions other than the bumps are protected by a resin covering.

Thereafter, the electronic element board can be cut into individual pieces to obtain the semiconductor devices.

The electronic component of the invention has the external electrodes over the stress relieving layer. For example, as an electronic component may be cited a semiconductor device.

The electronic component of the invention is manufactured by the above described method, and has a plurality of bumps formed on a mounting surface, and a resin covering the mounting surface avoiding at least the upper extremities of the bumps.

The semiconductor device of the invention comprises:
  a semiconductor chip having electrodes;
  a stress relieving layer provided on the semiconductor chip so as to avoid at least a part of the electrodes;
  wiring formed from the electrodes over the stress relieving layer; and
  external electrodes formed on the wiring over the stress relieving layer.

The wiring may be formed of any selected from the group comprising aluminum, aluminum alloy, chromium, a layer of copper or gold, two layers of copper and gold, two layers of chromium and copper, two layers of chromium and gold, two layers of platinum and gold, and three layers of chromium, copper and gold.

The wiring may be formed of a chromium layer over the stress relieving layer and a layer of at least one of copper and gold.

The wiring may include a titanium layer.

Titanium has excellent moisture resistance, and therefore lead breakages due to corrosion can be prevented. Titanium also has preferred adhesion with respect to polyimide resin, and provides excellent reliability when the stress absorbing layer is formed of polyimide resin.

The wiring may have one of a layer of nickel formed over the titanium layer and two-layers of platinum and gold.

In the semiconductor device, the semiconductor chip may have a protective film on the surface opposite to the surface having the electrodes.

The protective film may be of a material different from the material used for the wafer, and may have a melting point not less than the melting point of solder.

In the semiconductor device, the semiconductor chip may have a radiator on the surface opposite to the surface having the electrodes.

The semiconductor device is manufactured by the above described method, and has a plurality of bumps formed on a mounting surface, and a resin covering the mounting surface avoiding at least the upper extremities of the bumps.

The method of mounting an electronic component of the invention comprises:
  a step of applying flux to a mounting surface having a plurality of bumps formed on an electronic element until the bumps are included; and a reflow step of mounting the bumps on wiring on a circuit board with the flux interposed.

According to the invention, since a flux is applied to the mounting surface, even after mounting is completed with the reflow process, the flux remains to cover and protect the mounting surface. Moreover, it is not necessary to apply the flux so as to avoid the bumps, and the application can simply be made to the whole mounting surface including the bumps, so that the application can be carried out simply.

In the invention, as the electronic element may be used a semiconductor element.

On the circuit board of the invention is mounted the above described semiconductor device.

On the circuit board of the invention is mounted the above described semiconductor device having a plurality of bumps formed on a mounting surface, and a resin covering the mounting surface avoiding at least the upper extremities of the bumps.

The electronic instrument of the invention has this circuit board.

The electronic instrument of the invention has a circuit board on which is mounted a semiconductor device having a plurality of bumps formed on a mounting surface, and a resin covering the mounting surface avoiding at least the upper extremities of the bumps.

BEST MODE FOR CARRYING OUT THE INVENTION

The preferred embodiments of the invention are now described with reference to the drawings.

First Embodiment

Figure 5:
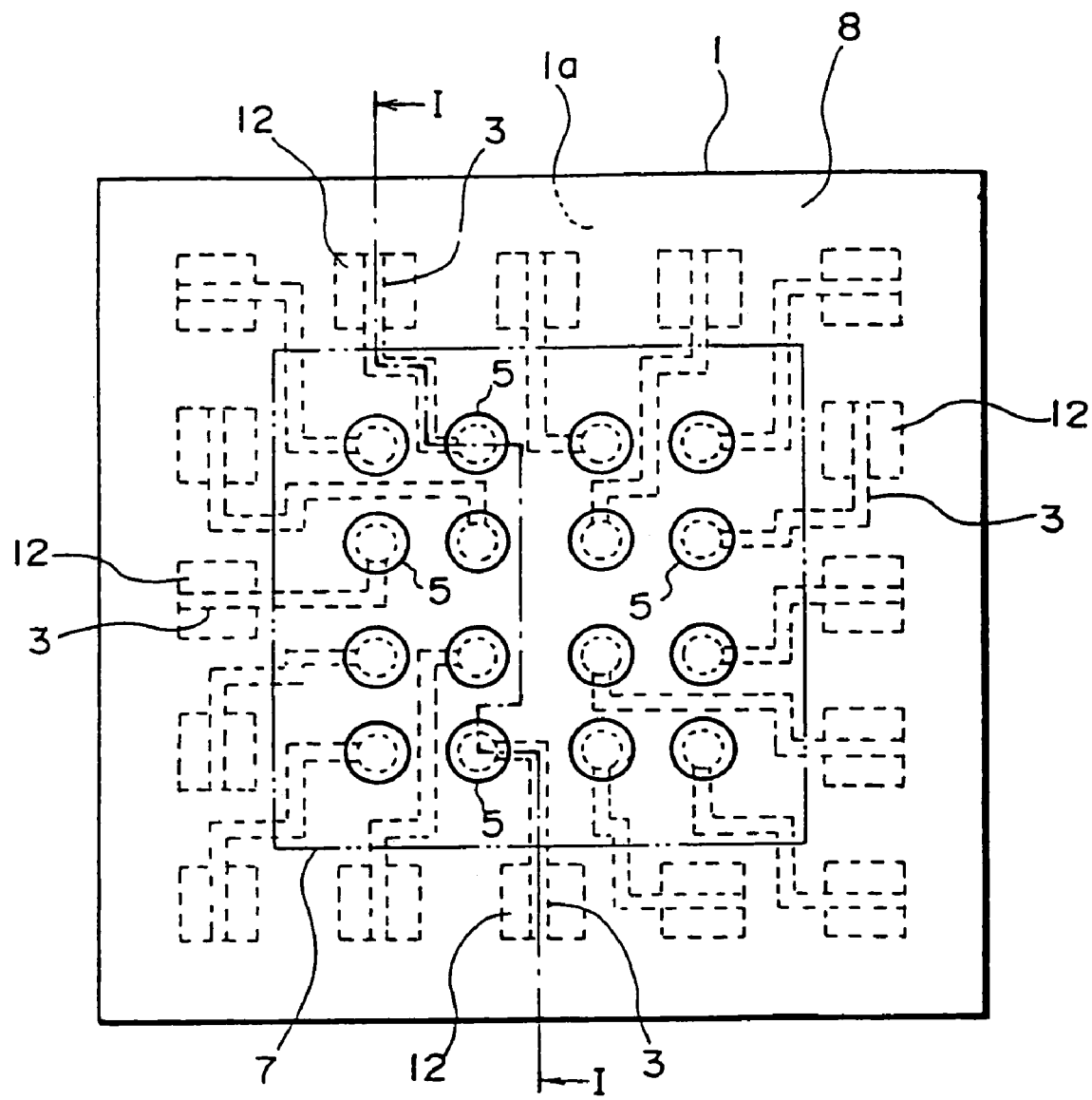
FIG. 5 is a plan view showing the first embodiment of the semiconductor device.

FIG. 5 is a plan view of a semiconductor device of this embodiment. This semiconductor device is classified as a so-called CSP, and has leads 3 formed extending toward the center of an active surface 1*a* from electrodes 12 formed around the periphery of a semiconductor chip 1, and on each lead 3 is provided an external electrode 5. All of the external electrodes 5 are provided on a stress relieving layer 7, so that when mounted on a circuit board (not shown in the drawings) the stresses can be relieved. Besides, in the region other than that of the external electrodes 5, a solder resist layer 8 is formed as a protective film.

The stress relieving layer 7 is formed at least in the region surrounding the electrodes 12. It should be noted that the electrodes 12 refer to the portions connected to the leads 3, and this definition is also used in all of the subsequent embodiments. Besides, when considering the provision of the region for forming the external electrodes 5, although not shown in FIG. 5, it is possible similarly to provide the external electrodes 5 so that the stress relieving layer 7 is on the outside of the electrodes 12, and leads 3 are provided to be brought out thereon. The fabrication process described below and shown in FIGS. 1A to 4C describes an example based on the assumption that there is also a stress relieving layer 7 provided on the outside of the electrodes 12 shown in FIG. 5.

The electrodes 12 are shown as an example of the so-called peripheral electrode type positioned on the periphery of the semiconductor chip 1, but equally an area array layout of semiconductor chip, in which the electrodes are formed in a region inside the peripheral region of the semiconductor chip, may be used. In this case, the stress relieving layer may be formed so as to avoid at least some of the electrodes.

It should be noted that as shown in this drawing the external electrodes 5 are provided not on the electrodes 12 of the semiconductor chip 1, but in the active region (the region in which the active elements are formed) of the semiconductor chip 1. By providing the stress relieving layer 7 in the active region, and further positioning (bringing in) the leads 3 within the active region, the external electrodes 5 can be provided within the active region. As a result, when laying out the external electrodes 5, the interior of the active region, that is to say, a region of a particular area can be provided, and thus the degree of freedom for positioning the external electrodes 5 is very greatly increased.

By bending the leads 3 on the stress relieving layer 7, the external electrodes 5 can be provided in a lattice. It should be noted that this is not an essential feature of the invention, and the external electrodes 5 may be provided in such a way as not necessarily to form a lattice. Besides, at the junction of the electrodes 12 and leads 3 the width of the electrodes 12 and the width of the leads 3 are such that:

leads 3<electrodes 12 but it is preferable that:

electrodes 12≦leads 3

In particular, in the case that:

electrodes 12<leads 3 not only is the resistance of the leads 3 reduced, but also, since the strength is increased, broken leads are prevented.

FIGS. 1A to 4C illustrate the first embodiment of the method of making a semiconductor device. These figures correspond to the section along the line I-I in FIG. 5, but show the state in which the stress relieving layer is further present outside the area of FIG. 5. FIGS. 1A to 4C are partial enlargements of a wafer, and in particular show one portion corresponding to a semiconductor device.

First, by according to well-known techniques, normally in the state before dicing is carried out, electrodes 12 and other elements are formed on a wafer 10. It should be noted that in this example, the electrodes 12 are formed of aluminum. As examples of other materials for the electrodes 12 may equally be used aluminum alloy materials (for example, aluminum-silicon or aluminum-silicon-copper, or the like) or copper alloys.

Besides, on the surface of the wafer 10 is formed a passivation film (not shown in the drawings) being an oxidized film or the like, for preventing chemical changes. The passivation film is formed not only to avoid the electrodes 12, but also to avoid the scribing line to which dicing is carried out. By not forming the passivation film on the scribing line, during the dicing operation the generation of dust from the passivation film can be avoided, and the occurrence of cracks in the passivation film can also be prevented.

Figure 1A:
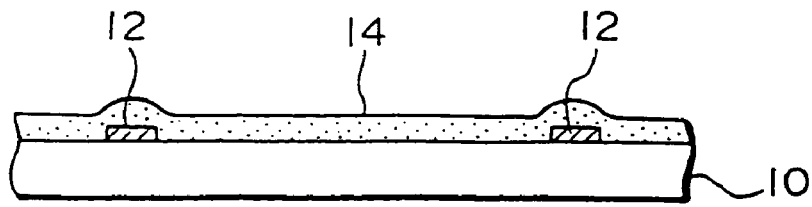
FIGS. 1A to 1E illustrate a first embodiment of the method of making a semiconductor device.

As shown in FIG. 1A, on the wafer 10 having the electrodes 12 a photosensitive polyimide resin is applied (using, for example, "the spin coating method") to form a resin layer 14.

The resin layer 14 has a thickness preferably in the range 1 to 100 μm, and more preferably of around 10 μm. It should be noted that in the spin coating method, since there is a large quantity of polyimide resin wasted, a device may be used which employs a pump to eject a tape-shaped polyimide resin. As an example of such a device may be given, for example, the FAS ultra-high-density ejection coating system (see U.S. Pat. No. 4,696,885) manufactured by the FAS company. It should be noted that the resin layer 14 referred to here has the function of the stress relieving layer 7 (see FIG. 5).

Figure 1B:
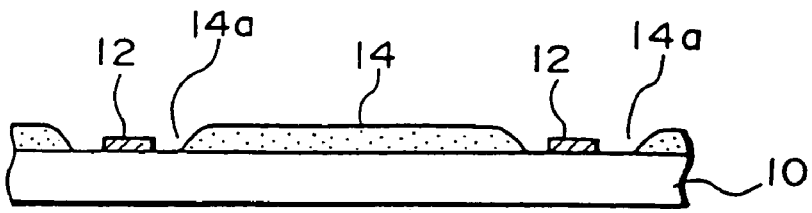

As shown in FIG. 1B, in the resin layer 14 are formed contact holes 14a opposing the electrodes 12. Specifically, by means of exposure, development, and baking processes, the polyimide resin in the vicinity of the electrodes 12 is removed, whereby the contact holes 14a are formed in the resin layer 14. It should be noted that in this figure, when the contact holes 14a are formed, absolutely no region is left in which the resin layer 14 overlaps the electrodes 12. By leaving absolutely none of the resin layer 14 on the electrodes 12, there is the advantage that in the subsequent stages in which wiring and other metallic components are provided, the electrical contact is satisfactory, but the construction is not necessarily restricted in this way. That is to say, even in a construction in which on the outer periphery of the electrodes 12 the resin layer 14 is applied, if holes are provided so that apart of the electrodes 12 is exposed, this will adequately achieve the objective. In this case, the number of bends in the wiring layer is reduced, and as a result, a loss of wiring reliability due to broken leads and the like can be prevented. Here, the contact holes 14a have a taper. Here, a taper refers to the fact that in the vicinity of the electrodes 12 (contact portion), the thickness of the resin layer 14 reduces closer to the electrodes 12. As a result, at the edges where the contact holes 14a are formed, the resin layer 14 is formed with an inclination. A formation of this type can be achieved by selection of the conditions of exposure and development. Furthermore, by treatment of the electrodes 12 by a plasma of $O_2$, $CF_4$, or the like, even if a small amount of the polyimide resin is left remaining on the electrodes 12, the polyimide resin can be completely removed. The resin layer 14 formed in this way forms the stress relieving layer in the completed semiconductor device.

It should be noted that in this example a photosensitive polyimide resin is used as the resin, but a nonphotosensitive resin may equally be used. For example, a silicone denatured polyimide resin, an epoxy resin, or a silicone denatured epoxy resin, or the like, being a material with a stress relieving function having a low Young's modulus (not exceeding $1 \times 10^{10}$ Pa) when solidified, may be used. If a nonphotosensitive resin is used, thereafter using a photoresist, the required form is obtained after passing through a photographic process.

Figure 1C:
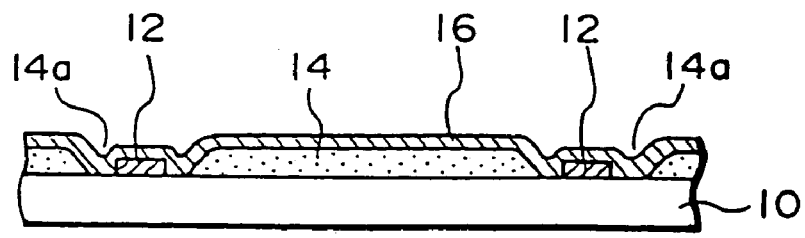

As shown in FIG. 1C, a chromium (Cr) layer 16 is formed by sputtering over the whole surface of the wafer 10. The wiring is finally formed from this chromium (Cr) layer 16. The chromium (Cr) layer 16 is formed over both the electrodes 12 and the resin layer 14. Here, the material of the chromium (Cr) layer 16 is selected to have good adhesion with the polyimide forming the resin layer 14. Alternatively, when resistance to cracks is considered, aluminum, an alloy of aluminum such as aluminum-silicon or aluminum-copper, an alloy of copper, copper (Cu), or a ductile metal such as gold may be used. If titanium, which has excellent moisture resistance, is selected, lead breakages due to corrosion can be prevented. Titanium also has preferred adhesion with respect to polyimide, and titanium-tungsten may also be used.

When the adhesion with the chromium (Cr) layer 16 is considered, it is preferable for the surface OT the resin layer 14 of polyimide or the like to be roughened. For example, by carrying out dry processing by exposing to a plasma ($O_2$, $CF_4$), or wet processing with an acid or alkali the surface of the resin layer 14 can be roughened.

Besides, since within the contact holes 14a the edges of the resin layer 14 are inclined, in this region the chromium (Cr) layer 16 is formed to be similarly inclined. In the semiconductor device which is the finished product the chromium (Cr) layer 16 forms the leads 3 (see FIG. 5), and also during the fabrication process serves as a layer to prevent dispersion of the polyimide resin at the time of thereafter forming the layer. It should be noted that the dispersion preventing layer is not restricted to chromium (Cr), and all of the above-mentioned wiring materials are also effective.

Figure 1D:
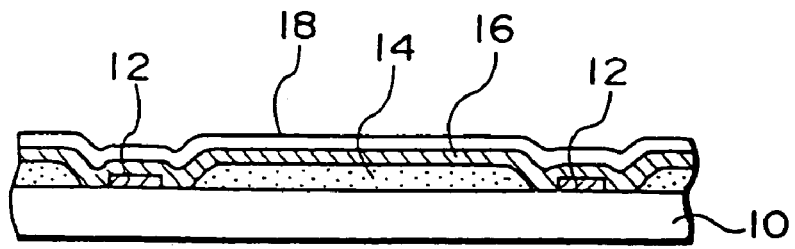

As shown in FIG. 1D, on the chromium (Cr) layer 16, a photoresist is applied to form a resist layer 18.

Figure 1E:
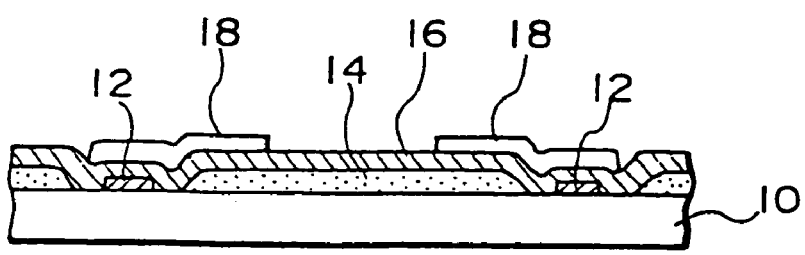

As shown in FIG. 1E, by means of exposure, development, and baking processes, a part of the resist layer 18 is removed. The remaining resist layer 18, is formed from the electrodes 12 in the direction of the center of the resin layer 14. In more detail, the remaining resist layer 18 is formed so that on the resin layer 14 the portion of the resist layer 18 on one electrode 12 and the portion of the resist layer 18 on another electrode 12 are not continuous (are mutually independent).

Next, leaving only the region covered by the resist layer 18 shown in FIG. 1E (that is to say, with the resist layer 18 as a mask), the chromium (Cr) layer 16 is etched, and the resist layer 18 is removed. With this, in these previous processes metal thin film formation technology in wafer processing is applied. The chromium (Cr) layer 16 thus etched is shown in FIG. 2A.

Figure 2A:
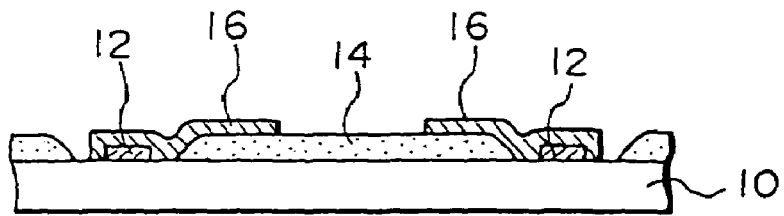
FIGS. 2A to 2E illustrate the first embodiment of the method of making a semiconductor device.

In FIG. 2A, the chromium (Cr) layer 16 is formed extending from the electrodes 12 over the resin layer 14. In more detail, the chromium (Cr) layer 16 is formed so as not to connect one electrode 12 to another electrode 12. That is to say, the chromium (Cr) layer 16 is formed in such a way that the wiring corresponding to the electrodes 12 can be formed. It should be noted that if the same signals are input or output, it is not necessary for electrodes 12 to be necessarily independent, and a piece of wiring carrying the same signal may equally be integrally formed.

Figure 2B:
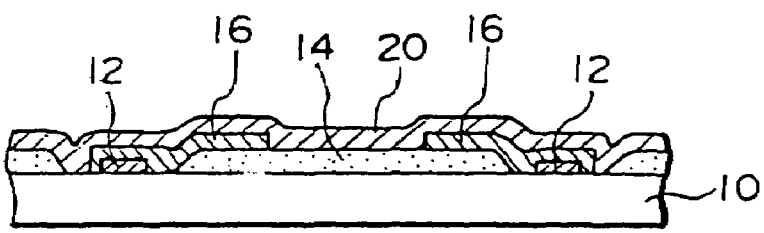

As shown in FIG. 2B, above the topmost layer including at least the chromium (Cr) layer 16, a copper (Cu) layer 20 is formed by sputtering. The copper (Cu) layer 20 forms an under-layer for forming external electrodes. Alternatively, in place of the copper (Cu) layer 20, a nickel (Ni) layer may be formed.

Figure 2C:
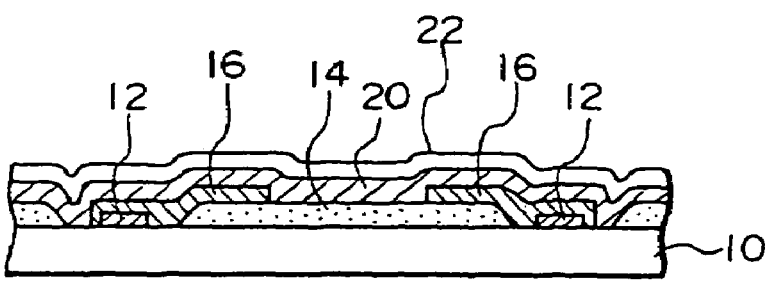
Figure 2D:
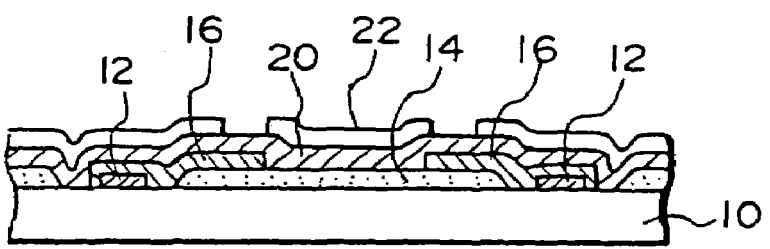

As shown in FIG. 2C, on the copper (Cu) layer 20 is formed a resist layer 22 (photoresist), and as shown in FIG. 2D, a part of the resist layer 22 is subjected to exposure, development, and baking processes, and removed. In this way, as for the region removed, at least a part of the resist layer 22 positioned over the resin layer 14, and over the chromium (Cr) layer 16 is removed.

Figure 2E:
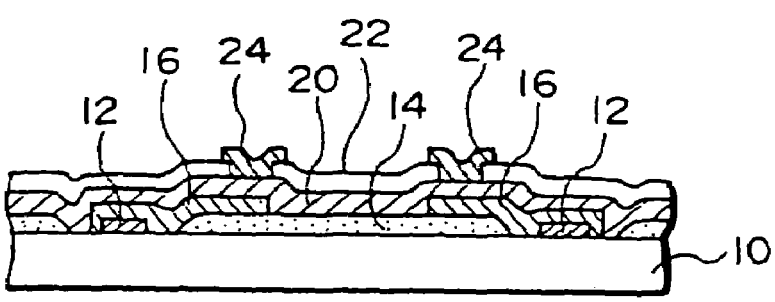

As shown in FIG. 2E, in the region in which the resist layer 22 is partially removed, a seat 24 is formed. The seat 24 is formed by copper (Cu) plating, and is such that a solder balls can be formed thereon. As a result, the seat 24 is formed on the copper (Cu) layer 20, and is electrically connected through this copper (Cu) layer 20 and the chromium (Cr) layer 16 to the electrodes 12.

Figure 3A:
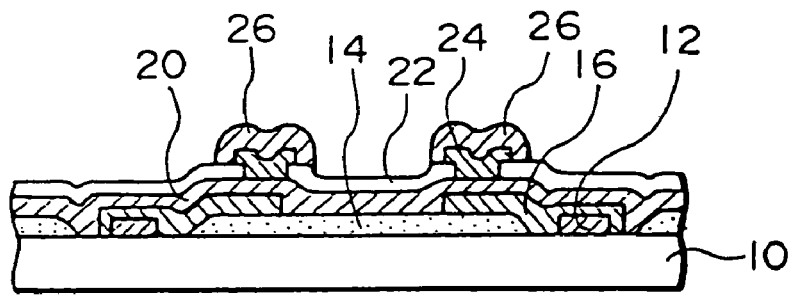
FIGS. 3A to 3D illustrate the first embodiment of the method of making a semiconductor device.

As shown in FIG. 3A, on the seat 24, solder 26 which will form solder balls as the external electrodes 5 (see FIG. 5) is formed as a thick film. This thickness is determined by the amount of solder corresponding to the ball diameter required when at a later state the solder balls are formed. The layer of solder 26 is formed by electroplating, printing, or the like.

Figure 3B:
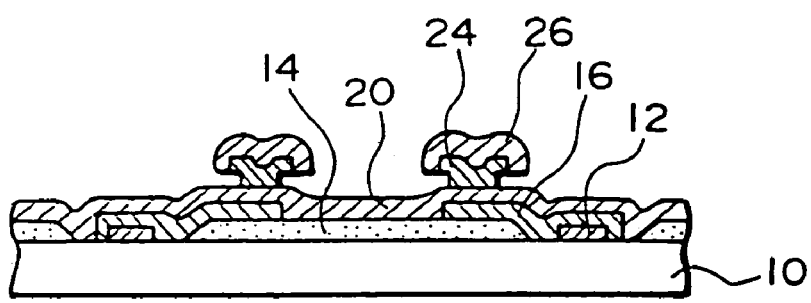
Figure 3C:
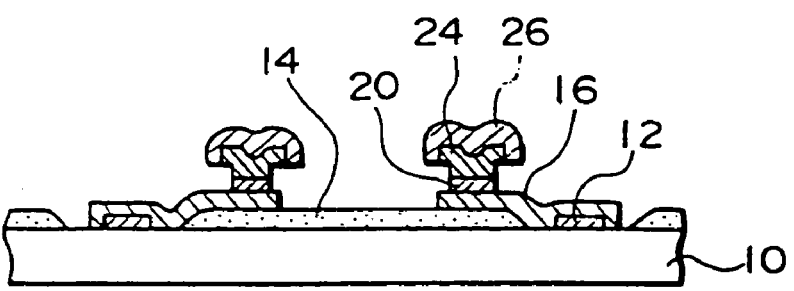
Figure 3D:
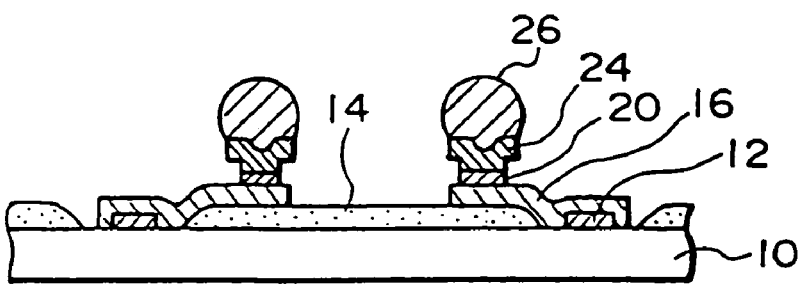

As shown in FIG. 3B, the resist layer 22 shown in FIG. 3A is removed, and the copper (Cu) layer 20 is etched. In this way, the seat 24 forms a mask, the copper (Cu) layer 20 remains only under this seat 24 (see FIG. 3C). Next, the solder 26 on the seat 24 is formed into balls of at least hemispherical shape by wet-back, making solder balls (see FIG. 3D). Here, wet-back refers to a process in which after forming a solder material on the position of forming external electrodes, reflow is carried out to form approximately spherical bumps.

By means of the above process, solder balls are formed as the external electrodes 5 (see FIG. 5). Next, processes for meeting the objectives of preventing the oxidation of the chromium (Cr) layer 16 or the like, of improving moisture resistance in the finished semiconductor device, of providing mechanical protection for the surface, and so forth, are carried out as shown in FIGS. 4A and 4B.

Figure 4A:
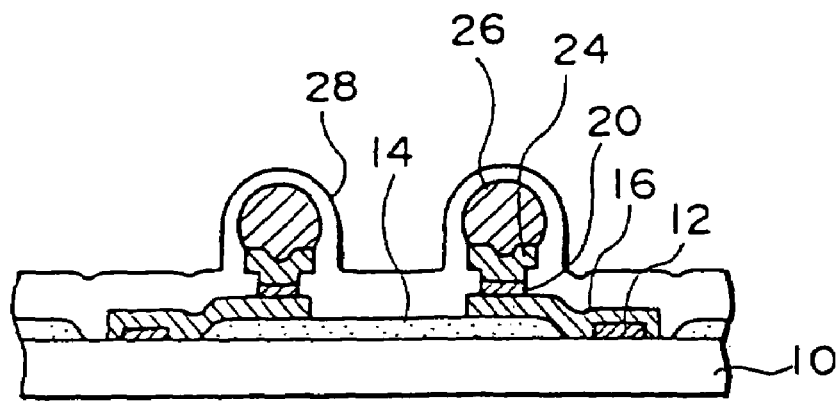
FIGS. 4A to 4C illustrate the first embodiment of the method of making a semiconductor device.
Figure 4B:
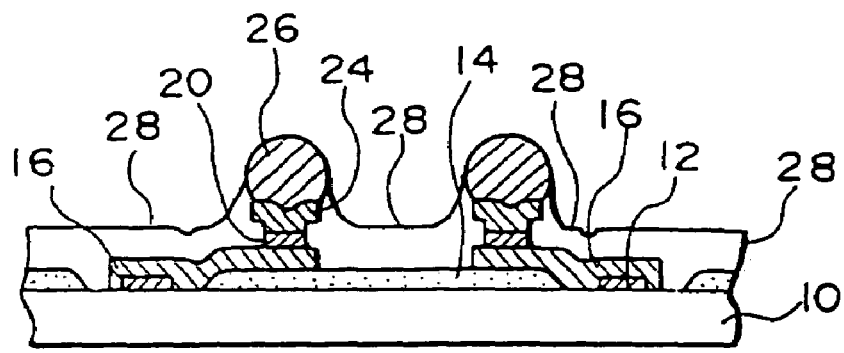

As shown in FIG. 4A, a photosensitive solder resist layer 28 is formed by application over the whole surface of the wafer 10. Then, by carrying out exposure, development, and baking processes, the portion of the solder resist layer 28 covering the solder 26 and the neighboring region is removed. In this way, the remaining solder resist layer 28 acts to prevent oxidation, and as a protective film in the finished semiconductor device, and further forms a protective layer for the purpose of improving moisture resistance. Next a test for electrical characteristics is carried out, and if required, a product number and manufacturer's name are printed.

Figure 4C:
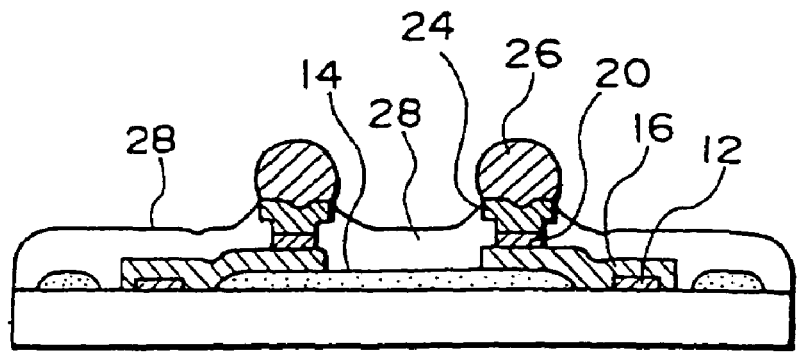

Next, dicing is carried out, and as shown in FIG. 4C, individual semiconductor devices are separated. Here, the dicing position (scribing line), as will be clear from a comparison of FIGS. 4B and 4C, is such as to avoid the resin layer 14. As a result, since dicing is only carried out on the wafer 10 having no passivation film or the like, problems involved in cutting through a number of layers of different materials can be avoided. The dicing process is carried out by a conventional method. It should be noted that FIGS. 4A and 4B show as far as an intermediate point of the resin layer 14 positioned on the outside of the electrodes, but FIG. 4C shows as far as a scribing line exceeding the resin layer 14 positioned on the outside of the electrodes.

With a semiconductor device formed in this way, the resin layer 14 forms a stress relieving layer 7 (see FIG. 5), and therefore stress occurring because of differences in coefficients of thermal expansion between a circuit board (not shown in the drawings) and the semiconductor chip 1 (see FIG. 5) is alleviated.

According to the above described method of making a semiconductor device, almost all steps are completed within the stage of wafer processing. In other words, the step in which the external terminals for connection to the board on which mounting is to take place is carried out within the stage of wafer processing, and it is not necessary to carry out the conventional packaging process, that is to say, in which individual semiconductor chips are handled, and for each individual semiconductor chip an inner lead bonding process and external terminal formation process are carried out. Besides, when the stress relieving layer is formed, a substrate such as a patterned film is not required. For these reasons, a semiconductor device of low cost and high quality can be obtained.

Besides, in this example, there may be two or more wiring layers. Generally, when layers are superimposed the layer thickness increases, and the wiring resistance can be reduced. In particular, when one layer of the wiring is of chromium (Cr), since copper (Cu) or gold has a lower electrical resistance than chromium (Cr), a combination makes it possible to reduce the wiring resistance. Alternatively, a titanium layer may be formed on the stress relieving layer, and on this titanium layer a nickel layer or a layer of platinum and gold may be formed. Besides, two layers of platinum and gold, may also be used for the wiring.

Second Embodiment

Figure 6A:
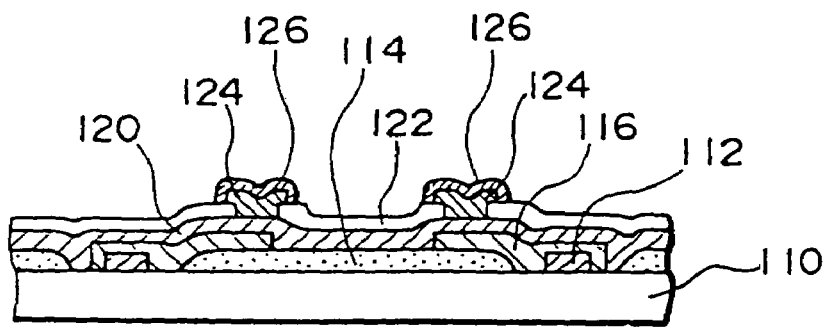
FIGS. 6A to 6C illustrate a second embodiment of the method of making a semiconductor devices.

FIGS. 6A to 7C illustrate the second embodiment of the method of making a semiconductor device. This embodiment differs from the first embodiment in the steps in FIG. 3A and subsequent steps, and in the steps up to FIG. 2E is the same as the first embodiment. Therefore, since the wafer 110, electrodes 112, resin layer 114, chromium (Cr) layer 116, copper (Cu) layer 120, resist layer 122, and seat 124 shown in FIG. 6A are the same as the wafer 10, electrodes 12, resin layer 14, chromium (Cr) layer 16, copper (Cu) layer 20, resist layer 22, and seat 124 shown in FIG. 2E, and the method of fabrication is the same as shown in FIGS. 1A to 2E, description is omitted here.

Figure 6B:
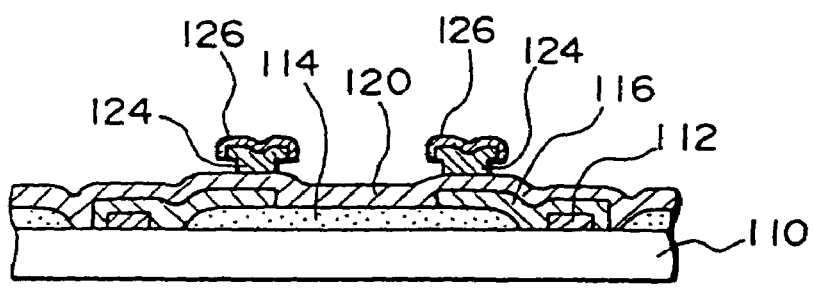
Figure 6C:
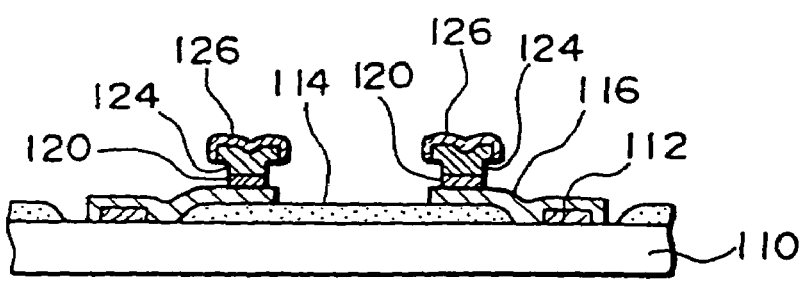

In this embodiment, as shown in FIG. 6A, a thin solder film 126 is formed by plating on the seat 124, and the resist layer 122 is removed, as shown in FIG. 6B. Furthermore, with the thin solder film 126 as a resist, as shown in FIG. 6C the copper (Cu) layer 120 is etched.

Figure 7A:
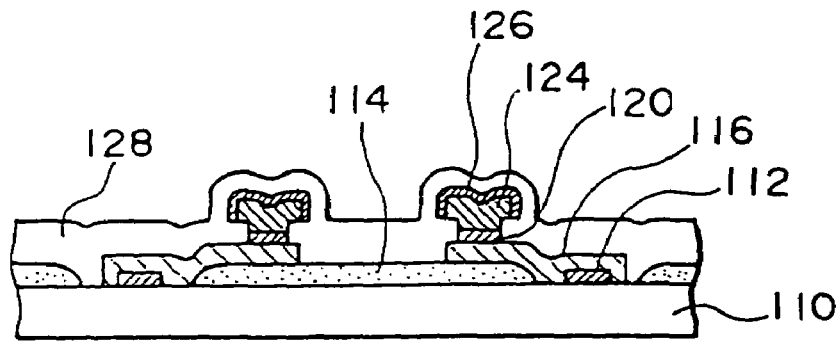
FIGS. 7A to 7C illustrate the second embodiment of the method of making a semiconductor device.
Figure 7B:
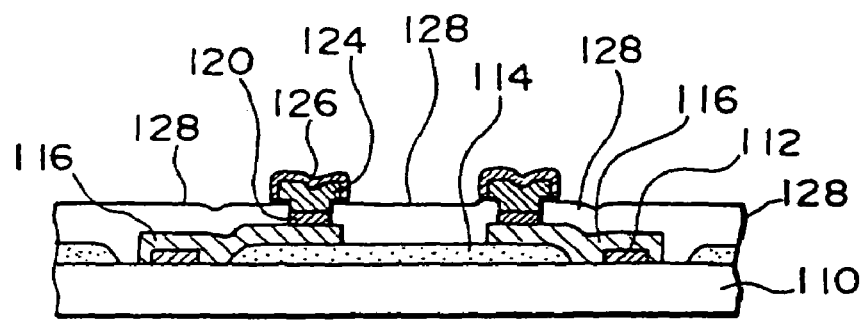

Next, as shown in FIG. 7A a photosensitive solder resist layer 128 is formed over the whole surface of the wafer 110, and as shown in FIG. 7B, the solder resist layer 128 in the region of the seat 124 is removed by exposure, development, and baking processes.

Figure 7C:
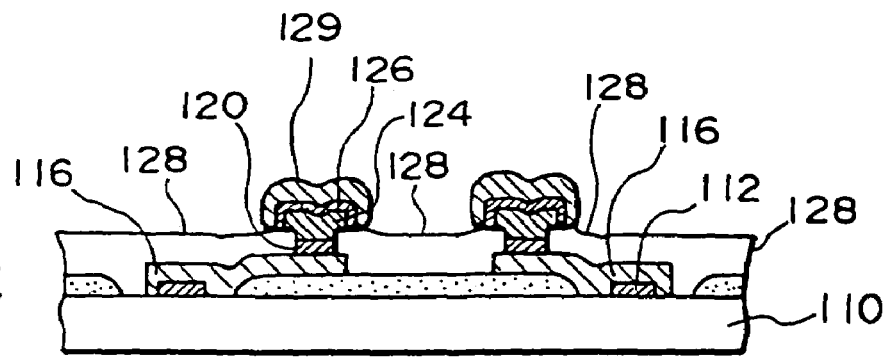

Next, as shown in FIG. 7C, on the seat 124 where the thin solder film 126 remains, a thick solder film 129, thicker than the thin solder film 126 is formed by plating. This is carried out by electroless plating. The thick solder film 129 is then subjected to wet-back, whereby in the same manner as shown in FIG. 3, balls of at least hemispherical shape are formed. In this way, the thick solder film 129 forms the solder balls of the external electrodes 5 (see FIG. 5). The subsequent process is the same as in the first embodiment described above. It should be noted that the thin solder film 126 and thick solder film 129 may be plated in that order, and thereafter a photosensitive solder resist layer (step of FIG. 7A) may be formed.

According to this embodiment again, almost all steps can be carried out within the stage of wafer processing. It should be noted that in this embodiment, the thick solder film 129 is formed by electroless plating. As a result, the seat 124 may be omitted, and the thick solder film 129 formed directly on the copper (Cu) layer 120.

Third Embodiment

FIGS. 8A to 9D illustrate the third embodiment of the method of making a semiconductor device.

Figure 8A:
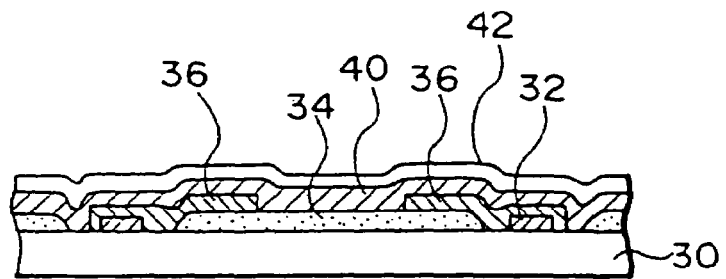
FIGS. 8A to 8D illustrate a third embodiment of the method of making a semiconductor device.

Since the wafer 30, electrodes 32, resin layer 34, chromium (Cr) layer 36, copper (Cu) layer 40 and resist layer 42 shown in FIG. 8A are the same as the wafer 10, electrodes 12, resin layer 14, chromium (Cr) layer 16, copper (Cu) layer 20, and resist layer 22 shown in FIG. 2C, and the method of fabrication is the same as shown in FIGS. 1A to 2C, description is omitted here.

Figure 8B:
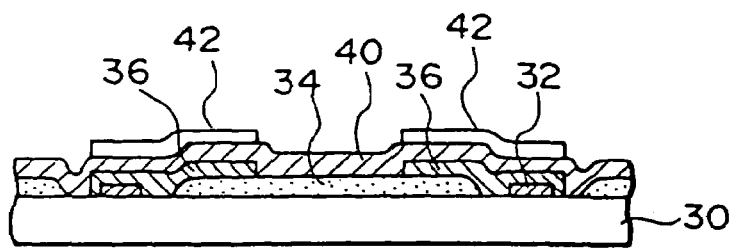

Next, a part of the resist layer 42 shown in FIG. 8A is removed by exposure, development, and baking processes. In more detail, as shown in FIG. 8B, only the resist layer 42 positioned over the chromium (Cr) layer 36 forming the wiring is left, and in other areas the resist layer 42 is removed.

Figure 8C:
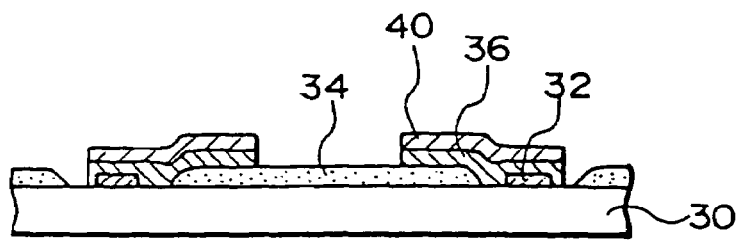

Next, the copper (Cu) layer 40 is etched and the resist layer 42 is removed, so that as shown in FIG. 8C, the copper (Cu)

layer 40 is left only on the chromium (Cr) layer 36. In this way, the wiring is formed as a two-layer construction from the chromium (Cr) layer 36 and copper (Cu) layer 40.

Figure 8D:
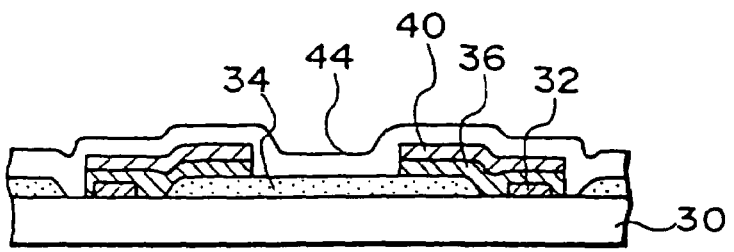

Next, as shown in FIG. 8D, a photosensitive solder resist is applied, and a solder resist layer 44 is formed.

Figure 9A:
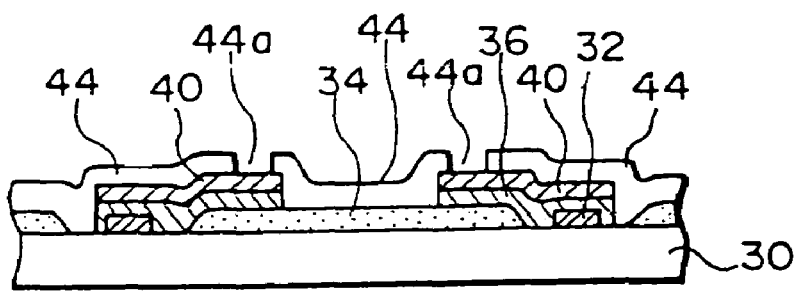
FIGS. 9A to 9D illustrate the third embodiment of the method of making a semiconductor device.

As shown in FIG. 9A, in the solder resist layer 44 are formed contact holes 44a. The contact holes 44a are formed over the resin layer 34 and over the copper (Cu) layer 40 which is the surface layer of the two-layer wiring. It should be noted that the formation of the contact holes 44a is carried out by exposure, development, and baking processes. Alternatively, the solder resist may be printed leaving holes in predetermined positions so as to form the contact holes 44a.

Figure 9B:
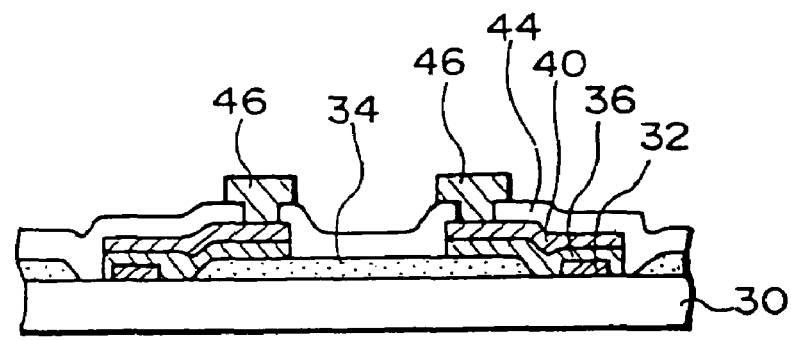
Figure 9C:
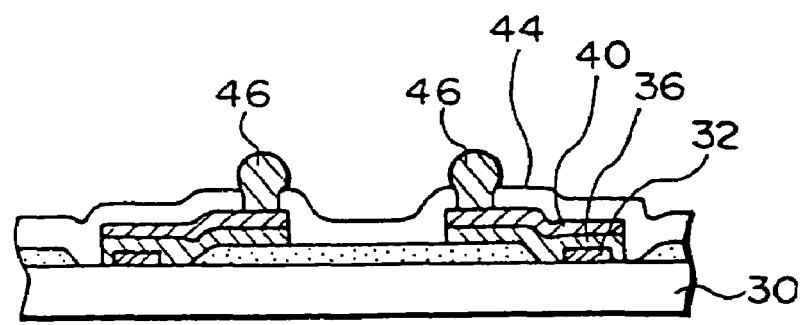
Figure 9D:
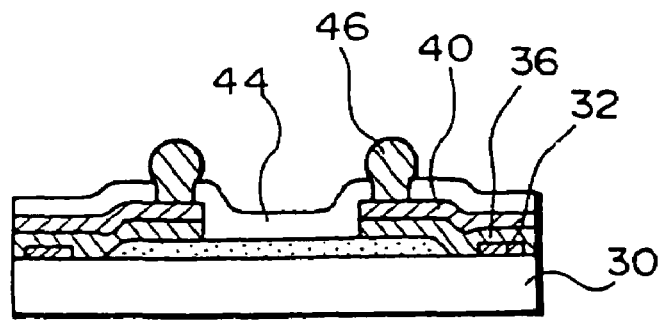

Next, a solder cream 46 is printed in the contact holes 44a to form a raised shape (see FIG. 9B). The solder cream 46 is formed by a wet-back process into solder balls as shown in FIG. 9C. Next, dicing is carried out, and the individual semiconductor device shown in FIG. 9D are obtained.

In this embodiment, the seat for the solder balls is omitted, and the printing of a solder cream is used, simplifying the formation of the solder balls, and also reducing the number of steps in the fabrication process.

Besides, the wiring of the fabricated semiconductor device is two-layer, of chromium (Cr) and copper (Cu). Here, chromium (Cr) has good adhesion with respect to the resin layer 34 formed of polyimide resin, and the copper (Cu) has good resistance to the formation of cracks. The good resistance to cracks allows lead breaks and damage to the electrodes 32 or active elements to be prevented. Alternatively, a copper (Cu) and gold two-layer, chromium (Cr) and gold two-layer, or chromium (Cr), copper (Cu), and gold three-layer wiring construction is also possible.

This embodiment is an example of not using a seat, but it goes without saying that it is also possible to provide a seat.

Fourth Embodiment

Figure 10:
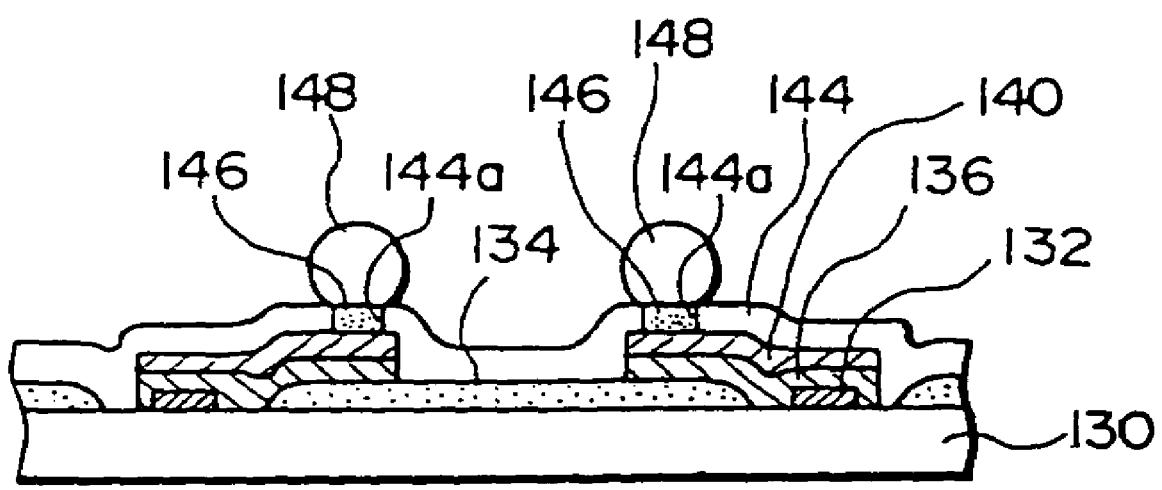
FIG. 10 illustrates a fourth embodiment of the method of making a semiconductor device.

FIG. 10 illustrates the fourth embodiment of the method of making a semiconductor device.

Since the wafer 130, electrodes 132, resin layer 134, chromium (Cr) layer 136, copper (Cu) layer 140 and solder resist layer 144 shown in this figure are the same as the wafer 30, electrodes 32, resin layer 34, chromium (Cr) layer 36, copper (Cu) layer 40 and solder resist layer 44 shown in FIG. 9A, and the method of fabrication is the same as shown in FIGS. 8A to 9A, description is omitted here.

In this embodiment, in place of the solder cream 46 used in FIG. 9B, to the contact holes 144a formed in the solder resist layer 144 flux 146 is applied and solder balls 148 are disposed thereon. Thereafter, a wet-back process, inspection, stamping, and dicing processes are carried out.

According to this embodiment, the preformed solder balls 148 are put in place, forming the external electrodes 5 (see FIG. 5). Besides, compared with the first and second embodiments, the seat 24 or 124 can be omitted. Furthermore, the leads 3 (see FIG. 5) are of a two-layer construction of the chromium (Cr) layer 136 and copper (Cu) layer 140.

This embodiment is an example of not using a seat, but it goes without saying that it is also possible to provide a seat.

Fifth Embodiment

FIGS. 11A to 12C illustrate the fifth embodiment of the method of making a semiconductor device.

Figure 11A:
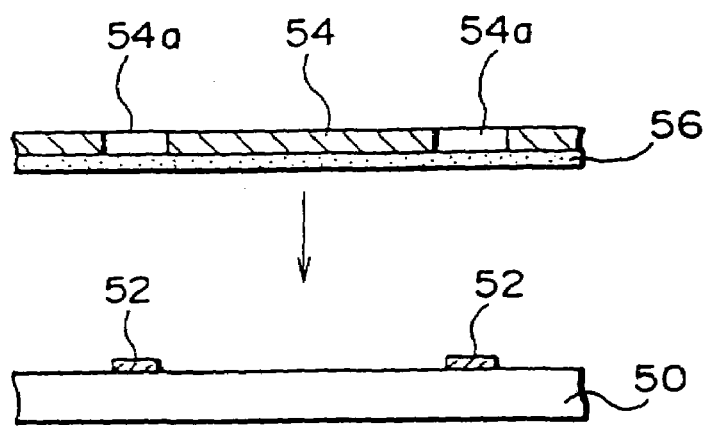
FIGS. 11A to 11C illustrate a fifth embodiment of the method of making a semiconductor device.

First, as shown in FIG. 11A, a glass plate 54 is adhered to a wafer 50 having electrodes 52. In the glass plate 54 are formed holes 54a corresponding to the electrodes 52 of the wafer 50, and an adhesive 56 is applied.

Figure 11B:
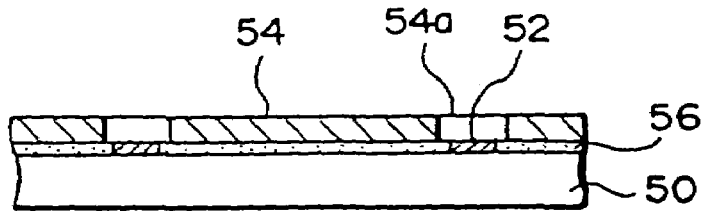

The coefficient of thermal expansion of the glass plate 54 has a value between the coefficient of thermal expansion of the wafer 54 forming the semiconductor chip and the coefficient of thermal expansion of the circuit board on which the semiconductor device is mounted. Because of this, since the coefficient of thermal expansion varies in order of the semiconductor chip obtained by dicing of the wafer 54, the glass plate 54, and the circuit board (not shown in the drawings) on which the semiconductor device is mounted, the differences in the coefficient of thermal expansion at the junctions is reduced, and the thermal stress is reduced. That is to say, the glass plate 54 acts as the stress relieving layer. It should be noted that in place of the glass plate 54 a ceramic plate may also be used, provided that it has a similar coefficient of thermal expansion. Then, when the glass plate 54 is adhered to the wafer 50, adhesive 56 which has entered the holes 54 is removed by an $O_2$ plasma process, as shown in FIG. 11B.

Figure 12A:
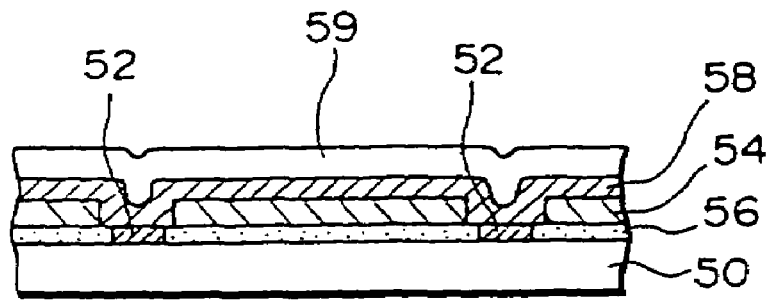
FIGS. 12A to 12C illustrate the fifth embodiment of the method of making a semiconductor device.
Figure 12B:
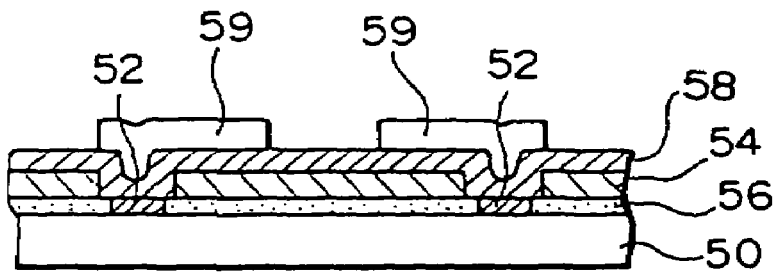

Next, as shown in FIG. 1C, on the glass plate 54, being the whole surface of the wafer 50, an aluminum layer 58 is formed by sputtering. Thereafter, if a film is formed on the surface of the holes 54, the aluminum, which is susceptible to lead breaks, can be protected. Next, as shown in FIG. 12A a resist layer 59 is formed, and as shown in FIG. 12B, exposure, development, and baking processes are used to remove a part of the resist layer 59. The part of the resist layer 59 removed is preferably the area other than the portion where the wiring pattern is formed.

In FIG. 12B, the resist layer 59 is left extending from over the electrodes 52 to over the glass plate 54. Besides, it is separated so as not to connect from over one electrode 52 to over another electrode 52.

Figure 12C:
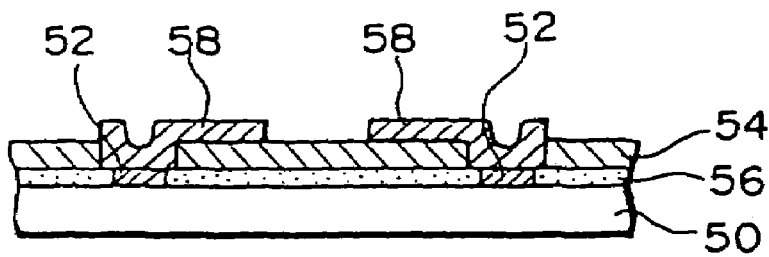

Next, when the aluminum layer 58 is etched, as shown in FIG. 12C, the aluminum layer 58 is left in the region to form the wiring. That is to say, the aluminum layer 58 extends from the electrodes 52 over the glass plate 54 to form the wiring. Besides, the aluminum layer 58 is formed so that different electrodes 52 are not electrically connected, and the wiring is provided for individual electrodes 52. Alternatively, if it is necessary for a plurality of electrodes 52 to be electrically connected together, the aluminum layer 58 may be formed so as to provide the corresponding wiring. It should be noted that for the wiring, in place of the aluminum layer 58 may also be applied any of the materials selected in the first embodiment.

By means of the above process, since the wiring from the electrodes 52 is formed, solder balls are formed on the aluminum layer 58 being the wiring, and individual semiconductor devices are cut from the wafer 50. These steps can be carried ott in the same way as in the first embodiment.

According to this embodiment, the glass plate 54 has holes 54a, but the formation of the holes 54a is easy. Therefore, with respect to the glass plate 54 patterning beforehand to form bumps or wiring is not necessary. Besides, for the steps such as that of forming the aluminum layer 58 being the wiring, metal thin film formation technology in wafer processing is applied, and almost all steps are completed within the stage of wafer processing.

It should be noted that on the glass plate 54 may be provided a separate stress absorbing layer, of for example polyimide resin or the like as in the first embodiment. In this case, since the stress absorbing layer is once again provided, the coefficient of thermal expansion of the glass plate 54 may be the same as that of silicon.

Sixth Embodiment

FIGS. 13A to 13D illustrate the sixth embodiment of the method of making a semiconductor device. In this example, as the stress relieving layer is selected a polyimide plate preformed in plate shape. In particular, polyimide includes compositions with a low Young's modulus, and therefore such a composition is selected as the stress relieving layer. It should be noted that alternatively, for example, a plastic plate or glass epoxy or similar composite plate may be used. In this case, it is preferable to use the same material as the board on which mounting takes place whereby the difference in the coefficient of thermal expansion is removed. In particular, since at present the use of a plastic substrate as the mounting board is common, it is effective to use a plastic plate as the stress relieving layer.

Figure 13A:
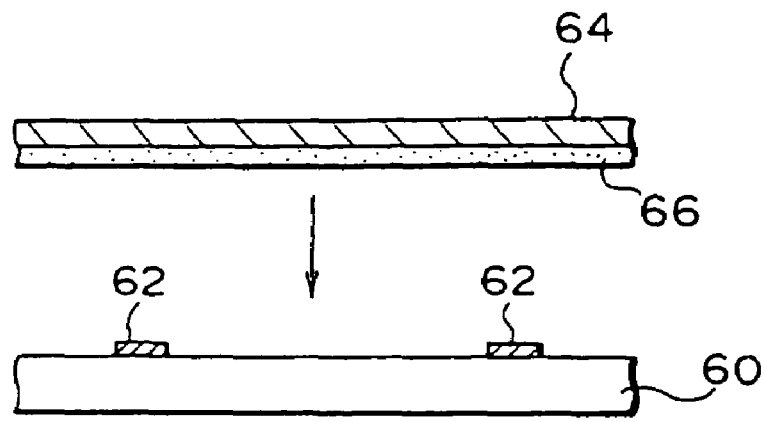
FIGS. 13A to 13D illustrate a sixth embodiment of the method of making a semiconductor device.
Figure 13B:
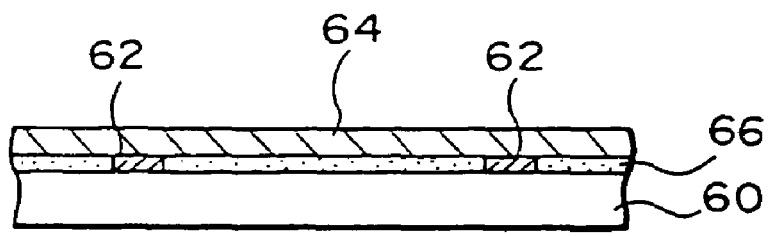

First, as shown in FIG. 13A, a polyimide plate 64 is adhered to a wafer 60 having electrodes 62, as shown in FIG. 13B. It should be noted that an adhesive 66 has been previously applied to the polyimide plate 64. It should also be noted that further improvement will be obtained by selecting as the adhesive 66 a material having a stress relieving function. Specific examples of adhesives having a stress relieving function are for example thermoplastic polyimide resin, silicone resin, or the like.

Figure 13C:
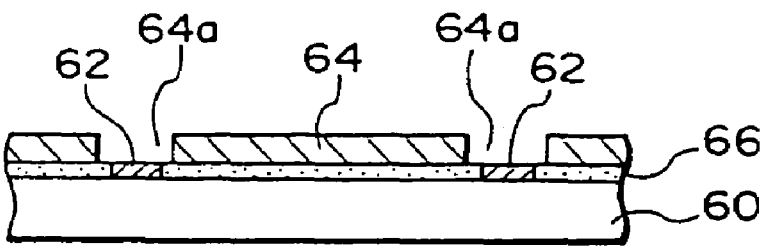
Figure 13D:
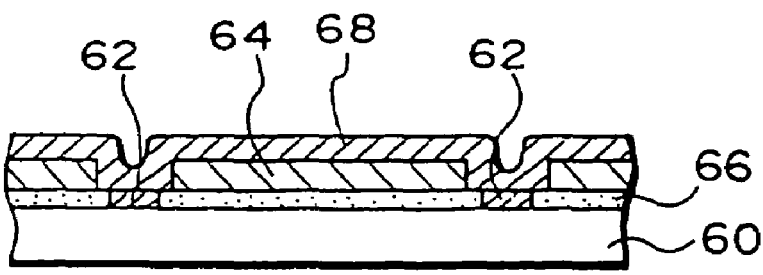

Next, as shown in FIG. 13C, in the region corresponding to the electrodes 62, contact holes 64a are formed, using for example an excimer laser, and as shown in FIG. 13D, an aluminum layer 68 is formed by sputtering. It should be noted that in place of the aluminum layer 68 may also be applied any of the materials selected in the first embodiment.

Figure 11C:
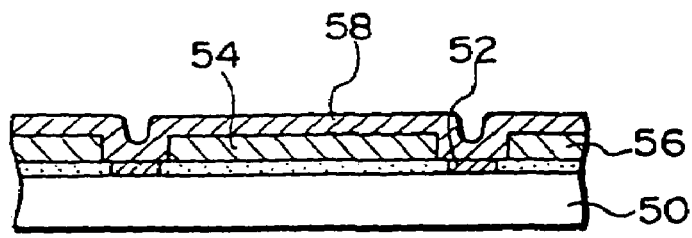

In this way, the same state as shown in FIG. 11C is reached, and therefore thereafter by carrying out the steps in FIG. 12A and subsequent figures, the semiconductor device can be fabricated.

According to this embodiment, since a polyimide plate 64 without even any holes being formed is used, a patterned substrate is not required. Other benefits are the same as for the first to fifth embodiments described above.

As another embodiment, the stress relieving layer may have holes formed mechanically in advance by drilling or similar means, and a positioning process may be used for subsequent alignment on the wafer. It is also possible to provide the holes by non-mechanical means, such as chemical etching or dry etching. It should be noted that if holes are formed by chemical etching or dry etching, this may be carried out on the wafer in a previous preparatory step.

Seventh Embodiment

Figure 16A:
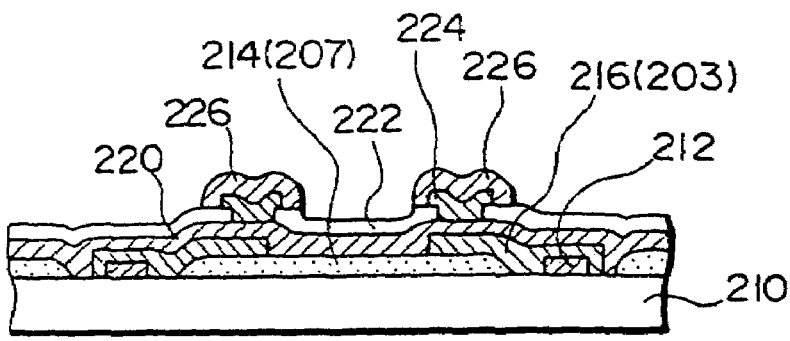
FIGS. 16A to 16D illustrate the seventh embodiment of the method of making a semiconductor device.
Figure 16B:
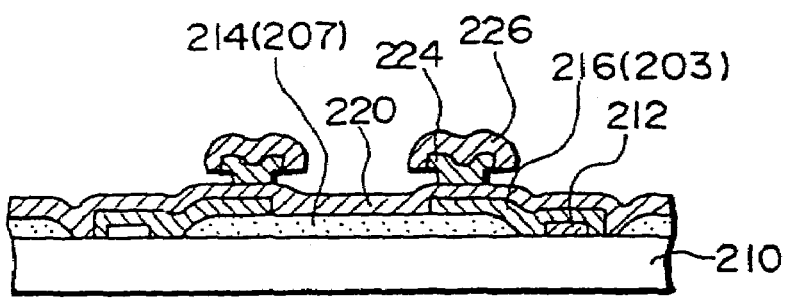
Figure 16C:
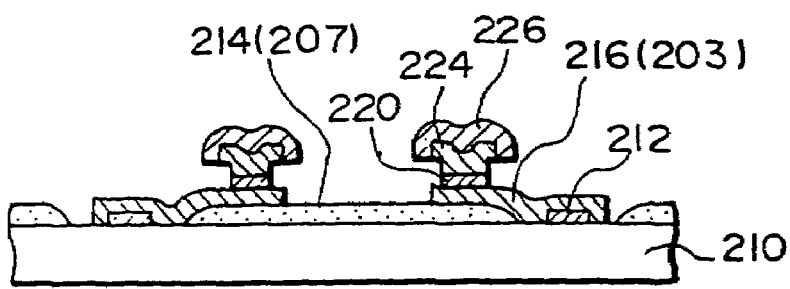
Figure 16D:
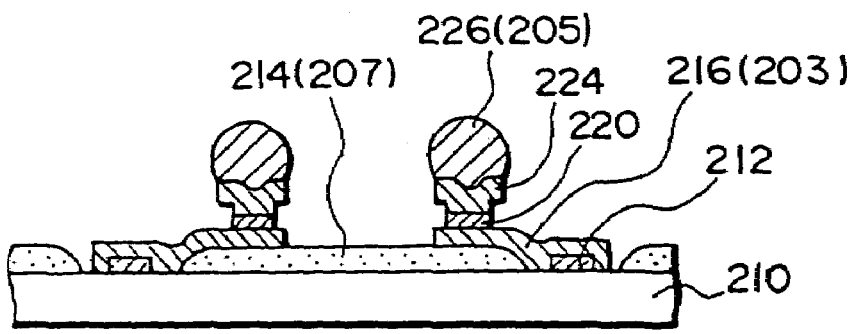
Figure 17A:
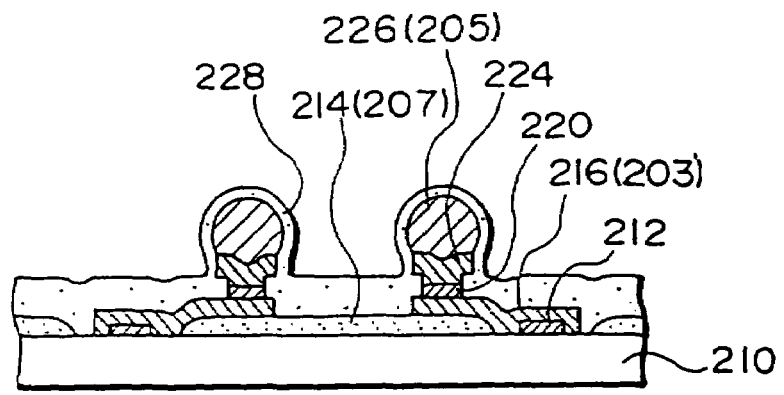
FIGS. 17A to 17C illustrate the seventh embodiment of the method of making a semiconductor device.
Figure 17B:
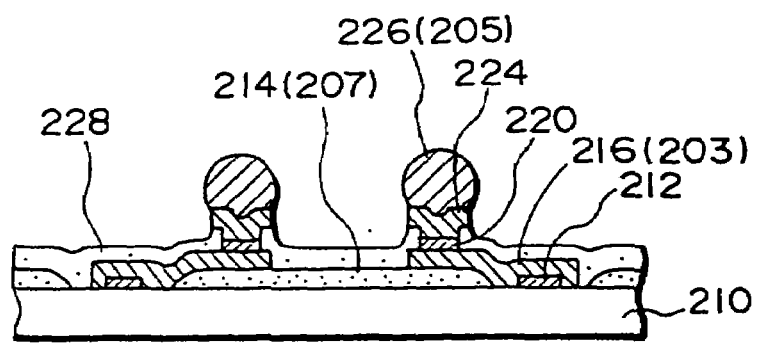
Figure 17C:
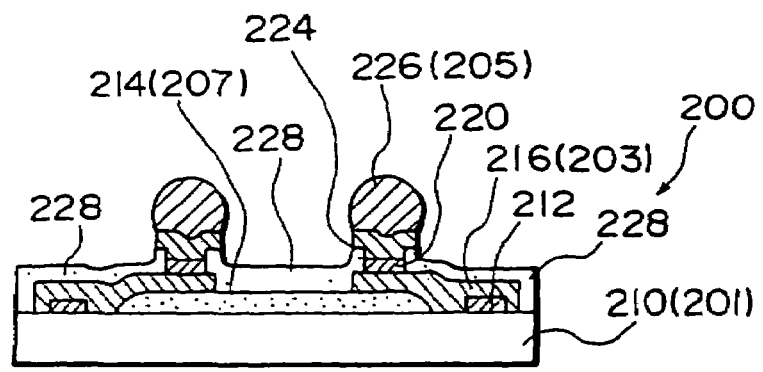
Figure 18:
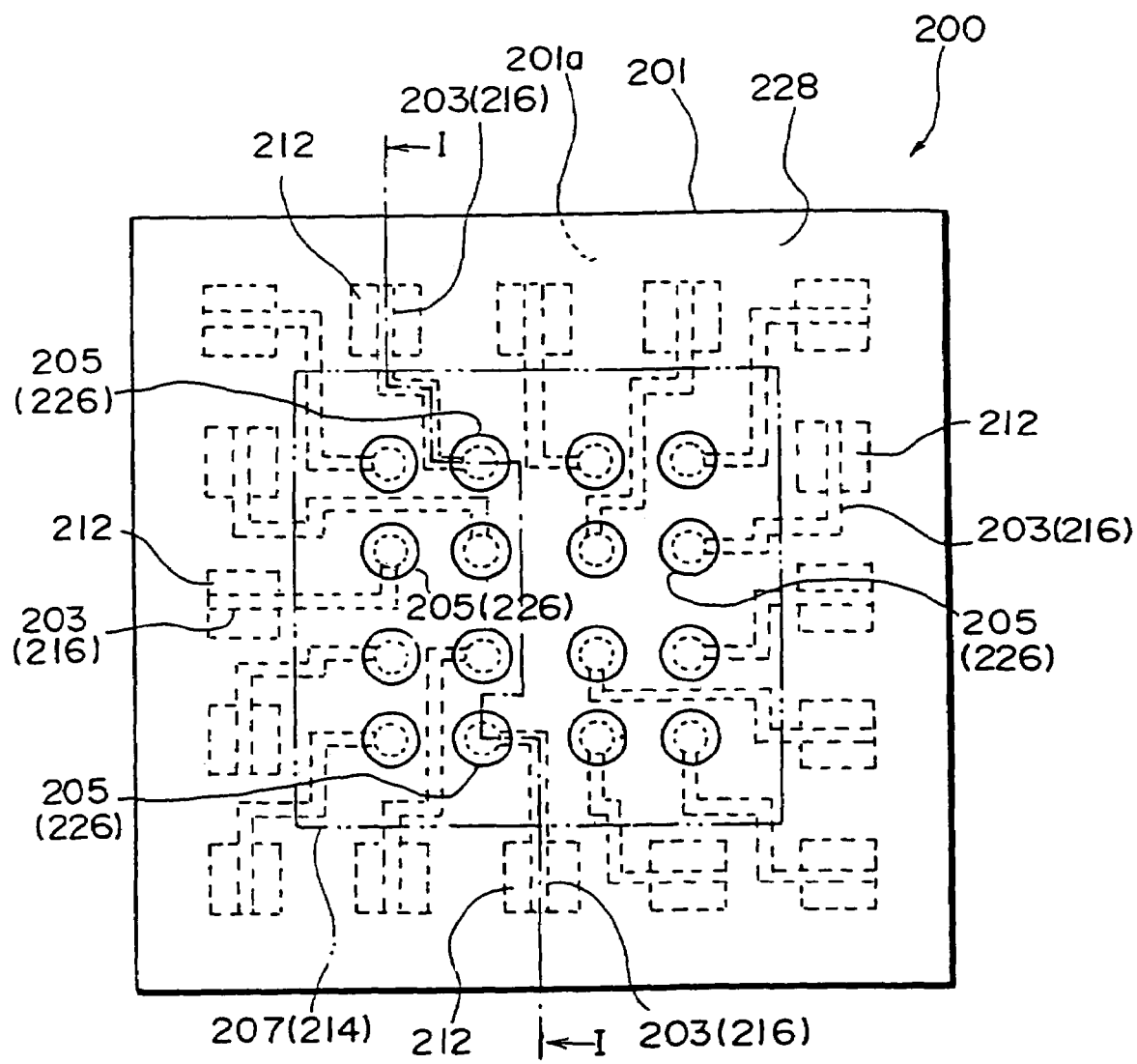
FIG. 18 is a plan view showing the seventh embodiment of semiconductor device.

FIGS. 14A to 17C illustrate the seventh embodiment of the method of making a semiconductor device, and correspond to a section along the line I-I in FIG. 18. It should be noted that FIG. 18 illustrates a semiconductor device relating to the seventh embodiment.

In this embodiment, the step of exposing bumps 205 from a solder resist layer 228 (see FIGS. 17A and 17B) is shown in more detail than in the first embodiment. Otherwise, this is the same as the first embodiment.

Figure 14A:
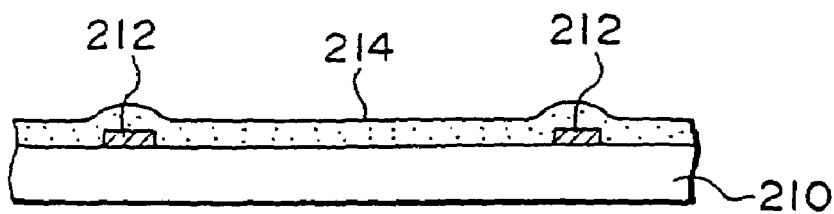
FIGS. 14A to 14E illustrate a seventh embodiment of the method of making a semiconductor device.

First, by well-known techniques, on a wafer 210 electrodes 212 and other elements are formed, and as shown in FIG. 14A, to the wafer 210 with the electrodes 212 a photosensitive polyimide resin is applied, and a resin layer 214 is formed. On the surface of the wafer 210, a passivation film is formed, avoiding the electrodes 212 and scribing lines.

Figure 14B:
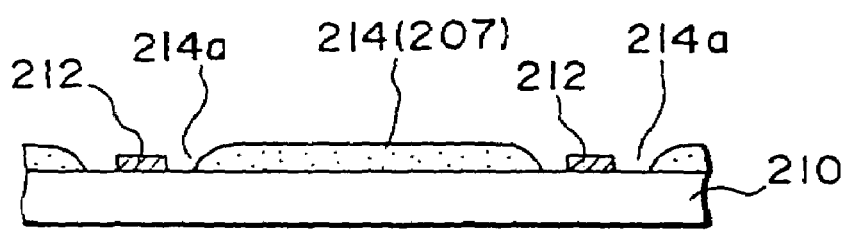

As shown in FIG. 14B, in the resin layer 214, contact holes 214a are formed, corresponding to the electrodes 212.

Figure 14C:
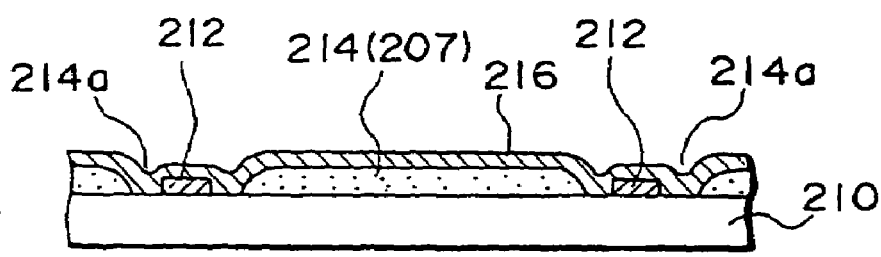

As shown in FIG. 14C, a chromium (Cr) layer 216 is formed on the whole surface of the wafer 210 by sputtering.

Figure 14D:
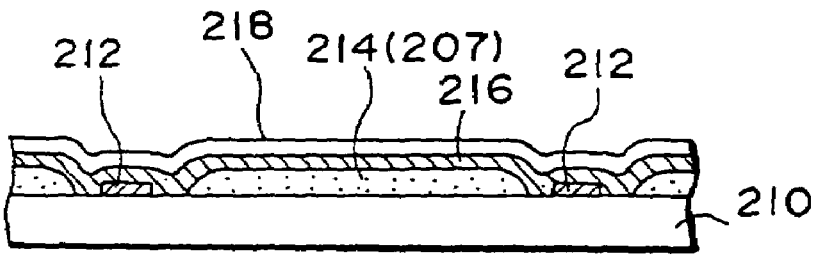

As shown in FIG. 14D, on the chromium (Cr) layer 216, a photoresist is applied, forming a resist layer 218.

Figure 14E:
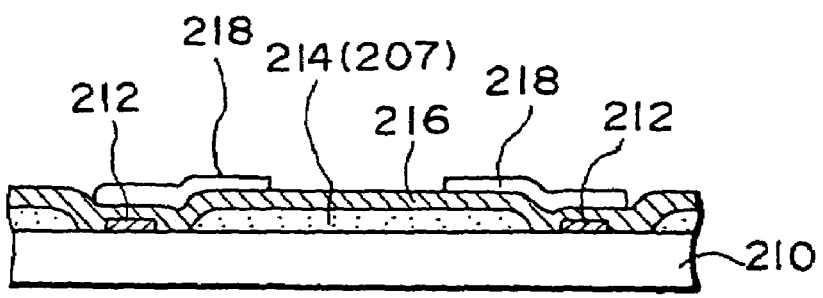

As shown in FIG. 14E, by means of exposure, development, and baking processes, a part of the resist layer 218 is removed. The remaining resist layer 218 is formed to extend from the electrodes 212 in the direction toward the center of the resin layer 214.

Next, as shown in FIG. 14E, the chromium (Cr) layer 216 is etched to leave only the region covered by the resist layer 218, and the resist layer 218 is removed. The chromium (Cr) layer 216 etched in this way is shown in FIG. 15A.

Figure 15A:
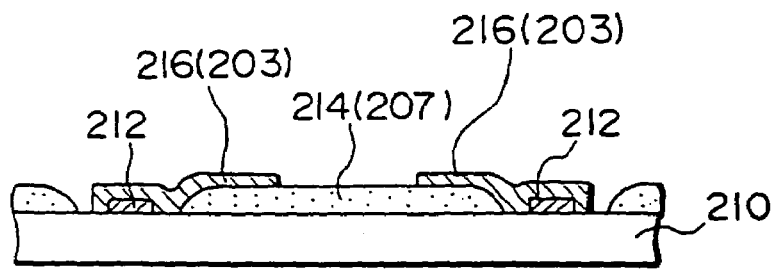
FIGS. 15A to 15E illustrate the seventh embodiment of the method of making a semiconductor device.

In FIG. 15A, the chromium (Cr) layer 216 is formed to extend from the electrodes 212 to the resin layer 214.

Figure 15B:
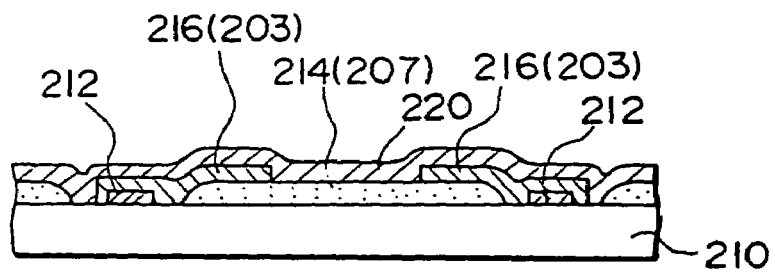
Figure 15C:
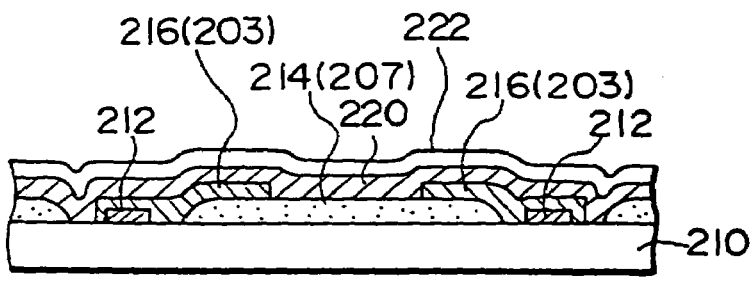
Figure 15D:
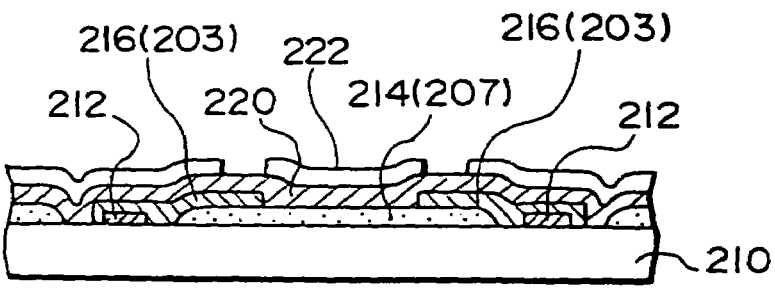

As shown in FIG. 15B, on the uppermost layer including at least the chromium (Cr) layer 216, a copper (Cu) layer 220 is formed by sputtering. As shown in FIG. 15C, on the copper (Cu) layer 220 a resist layer 222 is formed, and as shown in FIG. 15D, a part of the resist layer 222 is removed by exposure, development, and baking processes. In this way, as for the region removed, at least a part of the resist layer 222 which is both over the resin layer 214, and over the chromium (Cr) layer 216 is removed.

Figure 15E:
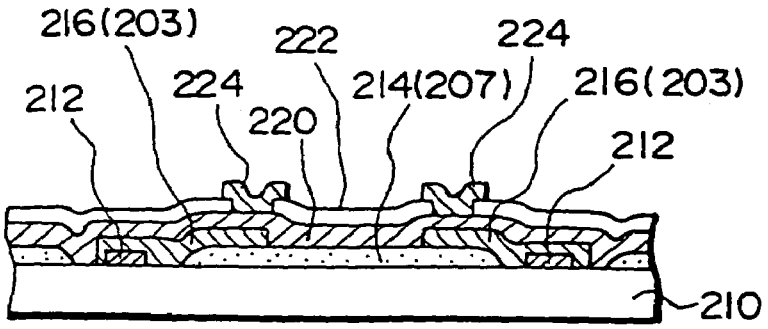

As shown in FIG. 15E, in the region where the resist layer 222 is partially removed, a seat 224 is formed. The seat 224 is formed by copper (Cu) plating, and is such that solder balls are formed on its top. As a result, the seat 224 is formed on the copper (Cu) layer 220, and connected through the copper (Cu) layer 20 and chromium (Cr) layer 216 to the electrodes 212.

As shown in FIG. 16A, on the seat 224, for the purpose of forming solder balls as the bumps 205 (see FIG. 18), solder 226 is formed in a thick layer. This thickness is determined by the amount of solder corresponding to the ball diameter required for subsequent formation of the solder balls. The layer of solder 226 is formed by electroplating or printing.

As shown in FIG. 16B, the resist layer 222 shown in FIG. 16A is removed, and the copper (Cu) layer 220 is etched. In this way, the seat 224 acts as a mask, and only the copper (Cu) layer 220 under the seat 224 remains (see FIG. 16C). Next, the solder 226 on the seat 224 is subjected to a wet-back process, whereby balls of at least hemispherical shape are formed, thus becoming the solder balls (see FIG. 16D).

By means of the above process, solder balls are formed as the bumps 205 (see FIG. 18). Next, processes for meeting the objectives of preventing the oxidation of the chromium (Cr) layer 216 or the like, of improving moisture resistance in the finished semiconductor device, of providing mechanical protection for the surface, and so forth, are carried out as shown in FIGS. 17A and 17B.

As shown in FIG. 17A, a resin is applied (by spin coating, dripping, or the like) over the whole surface of the wafer 210, and the solder resist layer 228 is formed.

In this embodiment, the solder resist layer 228 is also formed over the bumps 205. That is to say, the solder resist layer 228 may be formed over the whole surface of the wafer 210, and forming to avoid the bumps 205 is not necessary, as a result of which a simple application process is sufficient.

Here, the resin is applied overall, including the bumps 205, and then for example is formed into a film by hardening or another process, whereupon as shown in FIG. 17A, photosensitive resin applied to the bumps 205 flows over the surface of the wafer 210, as a result of which the thickness of the solder resist layer 228 varies. That is to, say, the solder resist layer 228 formed on the surface of the bumps 205 is thin, and other parts of the solder resist layer 228 formed on the wafer surface 10 is thick.

At this point, dry etching is carried out on such a solder resist layer 228. In particular, as the dry etching process is carried out conventional isotropic etching. Then, as shown in FIG. 17B, when the thin solder resist layer 228 on the bumps 205 is etched and removed, the etching process is completed. At this time, the thick solder resist layer 228 on the wafer 210 remains. By this means, the solder resist layer 228 can be left on the surface of the wafer 210 while avoiding the bumps 205, and this solder resist layer 228 forms a protective layer. In other words, the remaining solder resist layer 228 acts to prevent oxidation, and as a protective film in the finished semiconductor device, and further forms a protective layer for the purpose of improving moisture resistance. Next a test for electrical characteristics is carried out, and if required, a product number and manufacturer's name are printed.

By means of the above process, a lithography process on the solder resist layer 228 is not required, and the processing can be simplified leading to a reduction in cost.

Next, dicing is carried out, and as shown in FIG. 17C, and the wafer 210 is cut into semiconductor chips 201; Here, the dicing position, as will be clear from a comparison of FIGS. 17B and 17C, is such as to avoid the resin layer 214. As a result, since dicing is only carried out on the wafer 210, problems involved in cutting through a number of layers of different materials can be avoided. The dicing process is carried out by a conventional method.

With respect to a semiconductor device 200 fabricated as described above, since the resin layer 214 forms the stress relieving layer 207 (see FIG. 18), the stress created by the difference in coefficient of thermal expansion between the circuit board (not shown in the drawings), and the semiconductor chip 201 (see FIG. 18) can be absorbed.

FIG. 18 is a plan view of the semiconductor device relating to this embodiment. The semiconductor device 200 is classified as a so-called CSP, and as a result, the leads 3 are formed from the electrodes 212 of the semiconductor chip 201 in the direction toward the center of the active surface 201a, and on the wiring 203 are formed bumps 205. All of the bumps 205 are provided on the stress relieving layer 207, and therefore when mounted on a circuit board (not shown in the drawings) the stress can be absorbed. Besides, on the wiring 203, the solder resist layer 228 is formed as a protective layer.

It should be noted that in the above described embodiment, the semiconductor device is fabricated with almost the whole of the process in the wafer processing, and as a result the formation of the solder resist layer 228 as a protective layer was carried out during the wafer processing, but this is not a limitation. For example, an overall layer of resin may be applied to individual semiconductor devices including bumps, and then isotropic dry etching may be carried out to remove the resin from the bumps.

Eighth Embodiment

Figure 19A:
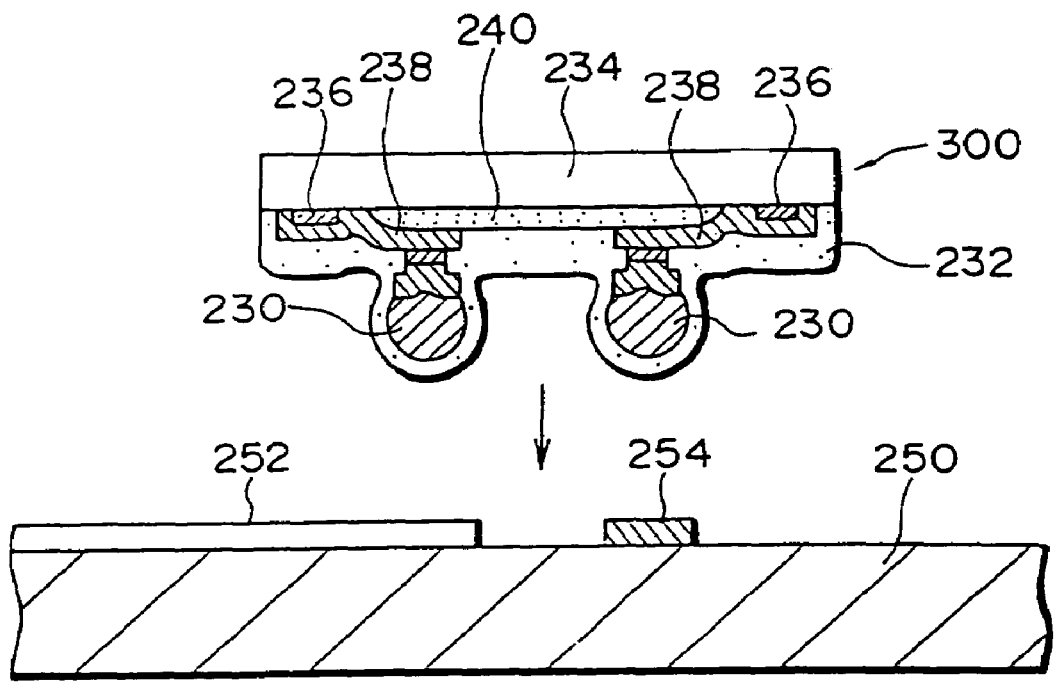
FIGS. 19A and 19B illustrate an eighth embodiment, of the method of mounting of a semiconductor device.
Figure 19B:
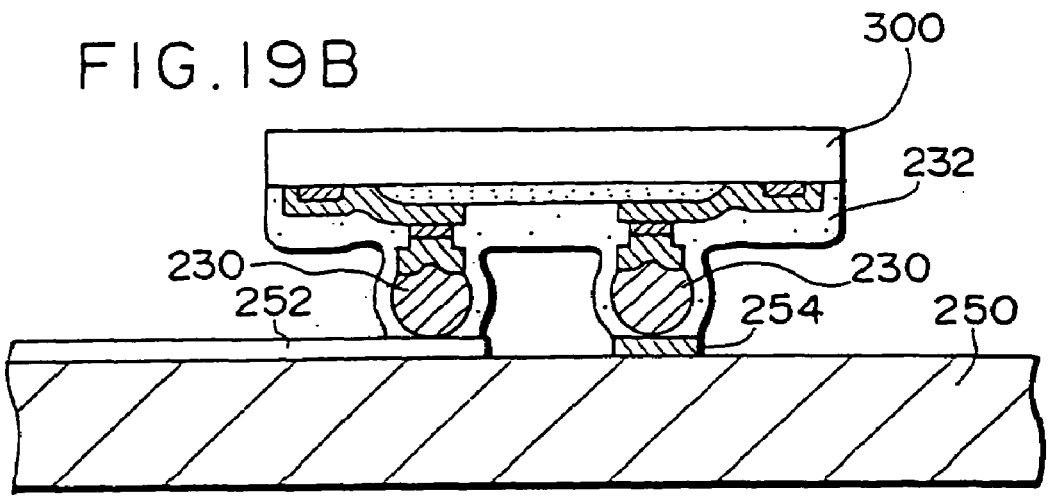

FIGS. 19A and 19B illustrate the eighth embodiment of the method of mounting of a semiconductor device. Here, a semiconductor device 300 has a similar construction to the semiconductor device 200 shown in FIG. 17C, except that a flux layer 232 is formed from over bumps 230. That is to say, wiring 238 is brought out from electrodes 236 of a semiconductor chip 234, and subjected to pitch conversion, then bumps 230 are formed on the wiring 238. Besides, since the wiring 238 is formed on the stress relieving layer 240, stress applied to the bumps 230 can be absorbed.

Here, the flux layer 232 is formed by applying an overall layer of flux, turning upward the bumps 230 of the semiconductor device 300. This application is carried out by spin coating or dripping. Besides, it is preferable that the flux used is such that when heated, the residue changes by chemical reaction into a thermoplastic polymer (for example, NS-501 manufactured by Nihon Speria). By this means, since the residue is chemically stable, ionization does not occur, and the electrical insulation properties are excellent.

The semiconductor device 300 having such a flux layer 232 is, as shown in FIG. 19A, mounted on a circuit board 250.

More specifically, as shown in FIG. 19B, with the flux layer 232 interposed, the bumps 230 are positioned on wiring 252 and 254 on the circuit board 250, and the semiconductor device 300 is mounted.

Next, by means of a reflow process, the solder forming the bumps 230 is melted, and the bumps 230 and wiring 252 and 254 are connected. The flux layer 232 is consumed during this soldering step. However, the flux layer 232 is consumed only in the vicinity of the bumps 230, and in other regions the flux layer 232 remains. The remaining flux layer 232 is heated in the reflow process, and as a result turns into a thermoplastic polymer resin, forming an insulating layer. As a result, the residue of this flux layer 232 forms a protective layer over the surface of the semiconductor device 300 on which the bumps 230 are formed.

Thus, according to this embodiment, the step of applying the flux is combined with the step of forming the protective layer, and therefore a step of forming a protective layer by lithography or the like is not required.

The invention is not restricted to the above described embodiments, and various modifications are possible. For example, the above described embodiments apply the invention to a semiconductor device, but the invention can be applied to various surface-mounted electronic components, whether active or passive. As electronic components, for example, may be cited resistors, capacitors, coils, oscillators, filters, temperature sensors, thermistors, varistors, variable resistors, and fuses.

OTHER EMBODIMENTS

The invention is not restricted to the above described embodiments, and various modifications are possible. For example, the above described embodiments apply the invention to a semiconductor device, but the invention can be applied to various surface-mounted electronic components, whether active or passive.

Figure 20:
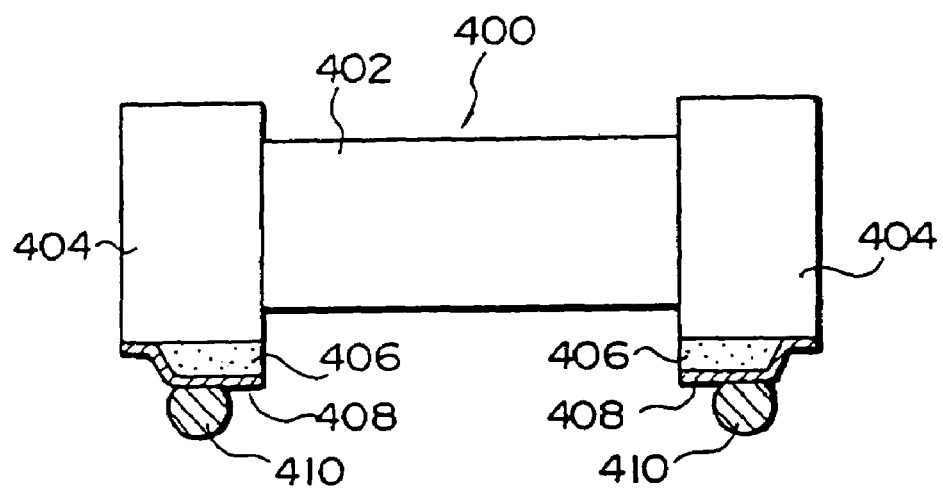
FIG. 20 shows an example in which the invention is applied to an electronic component for surface mounting.

FIG. 20 shows an example of a surface-mounted electronic component to which the invention is applied. In this figure, an electronic component 400 has a chip portion 402 at both ends of which are provided electrodes 404, and for example, this may be a resistor, capacitor, coil, oscillator, filter, temperature sensor, thermistor, varistor, variable resistor, or fuse. The electrodes 404 have, in the same way as in the embodiments described above, wiring 408 formed with a stress relieving layer 406 interposed. On this wiring 408, bumps 410 are formed.

Figure 21:
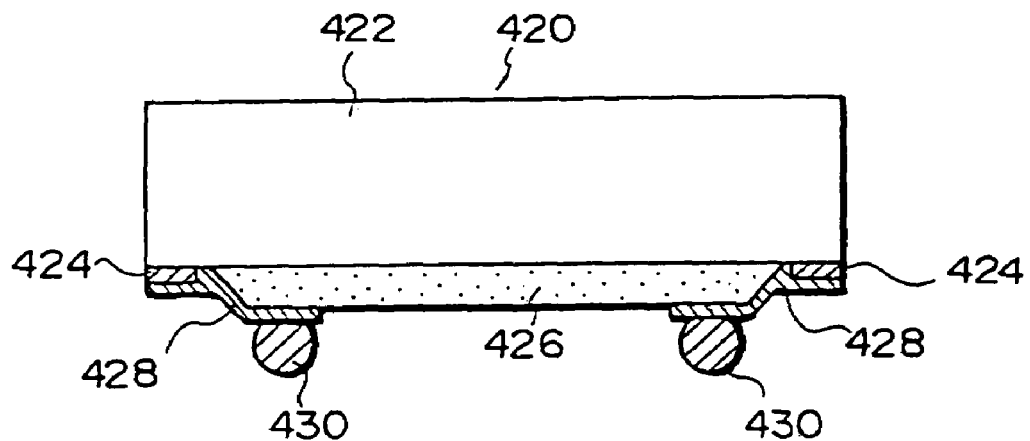
FIG. 21 shows an example in which the invention is applied to an electronic component for surface mounting.

Besides, FIG. 21 also shows an example of a surface-mounted electronic component to which the invention is applied; this electronic component 420 has electrodes 424 formed on the mounting surface of a chip portion 422, and wiring 428 formed with a stress relieving layer 426 interposed. On this wiring 428, bumps 430 are formed.

It should be noted that the method of fabrication of these electronic components 400 and 420 is the same as in the above described embodiments, and therefore description is omitted here. Besides, benefit obtained by formation of the stress relieving layers 406 and 426 is the same as in the above described embodiments.

Figure 22:
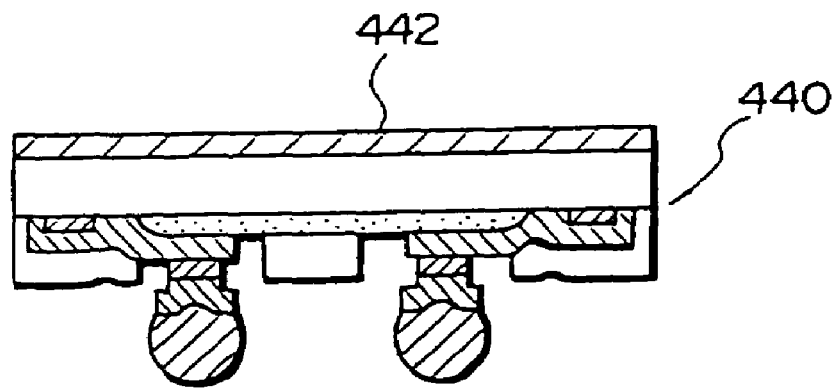
FIG. 22 shows an example in which a protective layer is formed on a semiconductor device to which the invention is applied.

Next, FIG. 22 shows an example in which a protective layer is formed on a semiconductor device to which the invention is applied. A semiconductor device 440 shown in this figure is the semiconductor device shown in FIG. 4C on which a protective layer 442 is formed, and since except for the protective layer 442 this is the same as the semiconductor device shown in FIG. 4C, description is omitted here.

The protective layer 442 on the semiconductor device 440 is formed on the side opposite to the mounting surface, that is to say, on the real surface. By so doing, the rear surface can be protected from damage.

Furthermore, damage to the semiconductor chip itself caused by cracks initiated by damage to the rear surface can be prevented.

The protective layer 442 is preferably formed on the rear surface of the wafer before cut into individual semiconductor devices 440. If this is done, a plurality of semiconductor devices 440 can have the protective layer 442 formed simultaneously. In more detail, it is preferable that after the metal thin film forming process is completed, the protective layer 442 is formed on the wafer. By so doing, the metal thin film forming process can be carried out smoothly.

The protective layer 442 is preferably of a material which can withstand the high temperature of the semiconductor device 440 reflow process. In more detail, it is preferable that it can withstand the temperature which is the melting point of the solder. That is to say, it is preferable that the protective layer 442 is of a material which has a melting point not less than the melting point of the solder. Besides, as the protective layer 442 may be used, for example, a resin. In this case, the protective layer 442 may be formed by application of a resin used as a potting resin. Alternatively, the protective layer 442 may be formed by attaching a sheet of material having either tackiness or adhesion. This sheet of material may be either organic or inorganic.

In this way, since the surface of the semiconductor device is covered with a substance other than silicon, for example, the marking qualities are improved.

Figure 23:
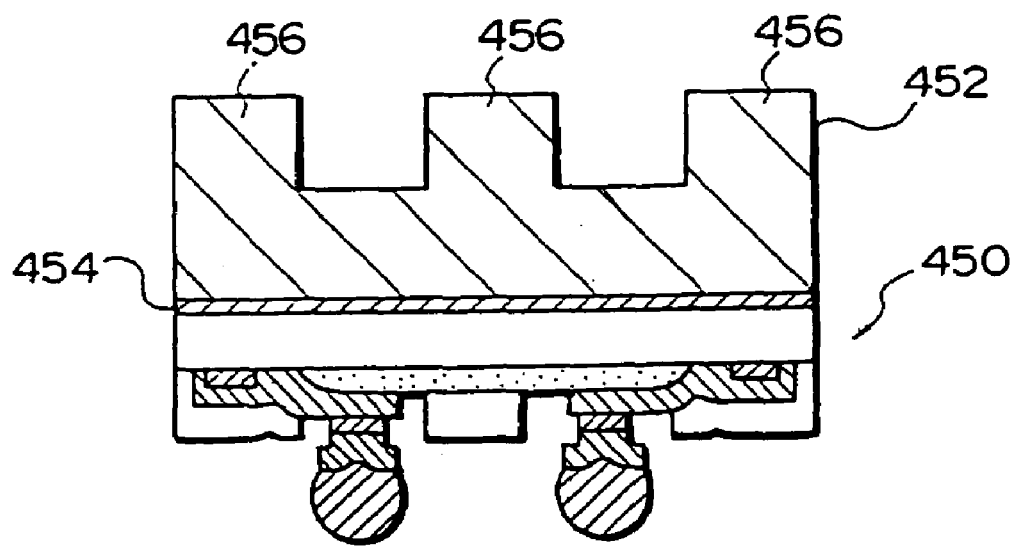
FIG. 23 shows an example in which a radiator is provided on the semiconductor device to which the invention is applied.

Next, FIG. 23 shows an example in which a radiator is fitted to a semiconductor device to which the invention is applied. A semiconductor device 450 shown in this figure is the semiconductor device shown in FIG. 4C to which a radiator 452 is fitted, and since except for the radiator 452 this is the same as the semiconductor device shown in FIG. 4C, description is omitted here.

The radiator 452 on the semiconductor device 450 is formed on the side opposite to the mounting surface, that is to say, on the rear surface, with a thermally conducting adhesive 454 interposed. By so doing, the heat dissipation properties are improved. The radiator 452 has a plurality of fins 456, and these are commonly formed of copper, copper alloy, aluminum nitride, or the like. It should be noted that in this example, an example with fins is shown, but a radiator without fins (radiating plate) may also be used to obtain an appropriate radiation effect. In this case, since a simple plate is attached, the handling is simple, and the cost can also be reduced.

In the above described embodiments, solder bumps or gold bumps are provided in advance as external terminals on the semiconductor device, but as other examples, without using solder bumps or gold bumps on the semiconductor device, for example, a seat of copper or the like may be used, as its is, for an external terminal. It should be noted that in this case, it is necessary to provide solder on the connecting portion (land) of the mounting board for a semiconductor device (motherboard) before it is mounted.

Besides, the polyimide resin used in the above described embodiments is preferably black. By using a black polyimide resin as the stress relieving layer, operating faults when light impinges on the semiconductor chip can be avoided, and also with an increase in the durability with respect to light the reliability of the semiconductor device can also be improved.

Figure 24:
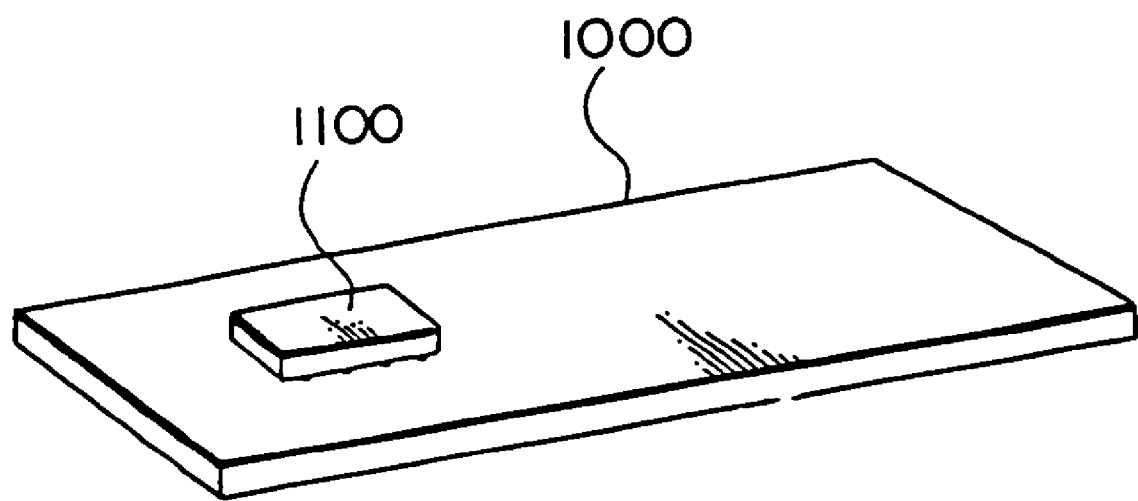
FIG. 24 shows a circuit board on which is mounted an electronic component fabricated by application of the method of the invention.
Figure 25:
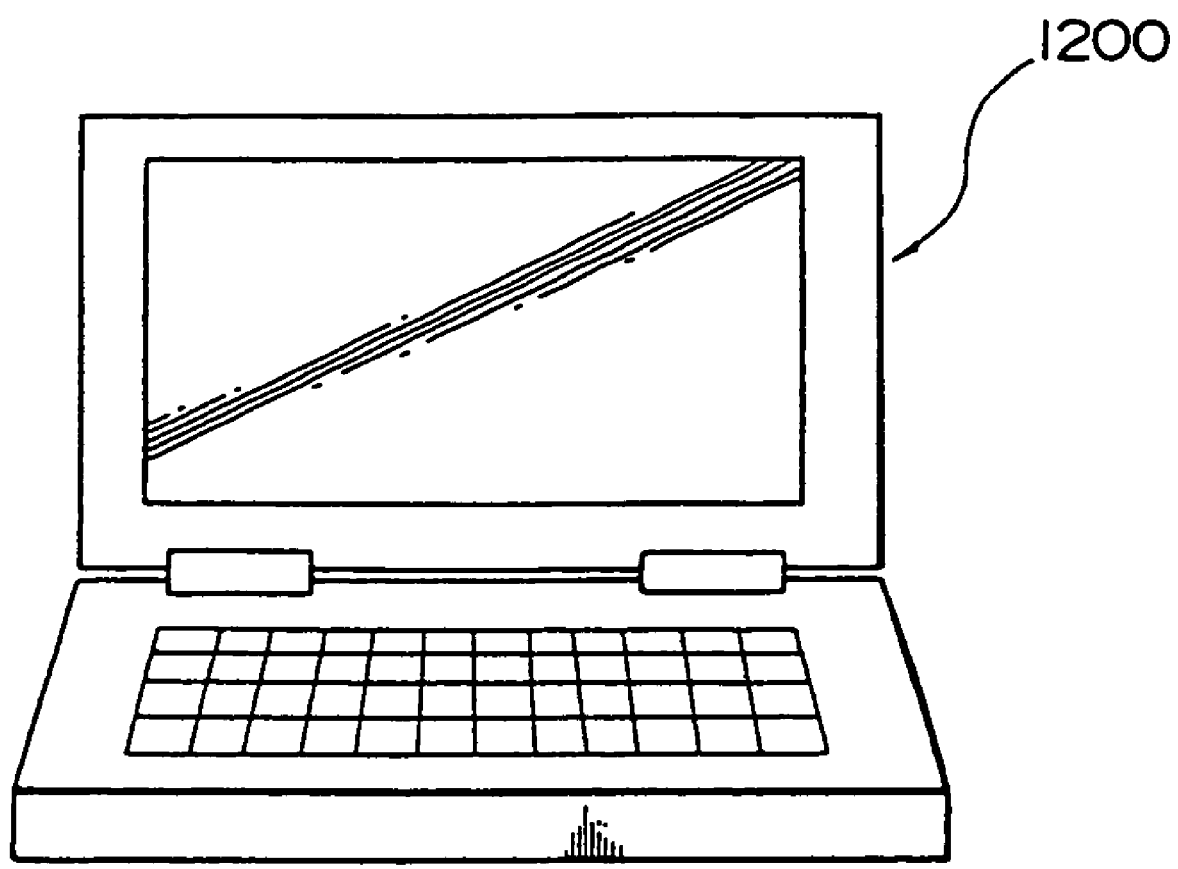
FIG. 25 shows an electronic instrument provided with a circuit board on which is mounted an electronic component fabricated by, application of the method of the invention.

It should be noted that in FIG. 24 is shown a circuit board 1000 on which is mounted an electronic component 1100 being a semiconductor device or the like fabricated according to the methods of the above described embodiments. Moreover, as an electronic instrument provided with this circuit board 1000, FIG. 25 shows a notebook personal computer 1200.

What is claimed is:

1. A semiconductor device, comprising:
    a semiconductor chip that has a first surface and a second surface opposite to the first surface;
    a first electrode that is formed on the first surface of the semiconductor chip;
    a stress relieving layer that is provided on the first surface of the semiconductor chip so as to avoid at least a part of the first electrode;
    a protective film that is formed on the second surface of the semiconductor chip;
    a wiring that extends from the first electrode to the stress relieving layer, a first portion of the wiring being disposed on at least a part of the stress relieving layer, the first portion of the wiring having a width narrower than a width of the first electrode in a direction parallel to the first surface of the semiconductor chip; and
    a second electrode that is formed on the wiring, the second electrode being formed above the stress relieving layer.

2. The semiconductor device of claim 1, the wiring being formed of any one selected from a group consisting of aluminum, aluminum alloy, chromium, a layer of copper, a layer of gold, two layers of copper and gold, two layers of chromium and copper, two layers of chromium and gold, two layers of platinum and gold, and three layers of chromium, copper and gold.

3. The semiconductor device of claim 1, the wiring being formed of a chromium layer over the stress relieving layer and a layer of at least one of copper and gold.

4. The semiconductor device of claim 1, the wiring including a titanium layer.

5. The semiconductor device of claim 4, the wiring having one of a layer of nickel formed over the titanium layer and two layers of platinum and gold.

6. The semiconductor device of claim 1, the protective film having a melting point not less than a melting point of solder.

7. The semiconductor device of claim 1, further comprising:
    a radiator being formed on the protective film.

8. The semiconductor device of claim 1, the stress relieving layer having a sloping end portion, the first portion of the wiring being disposed on the sloping end portion.

9. The semiconductor device of claim 1, a second portion of the wiring having a width greater than a width of the first electrode.

10. A semiconductor device, comprising:
    a semiconductor chip that has a first surface and a second surface opposite to the first surface;

a first electrode that is formed on the first surface of the semiconductor chip;
a first resin layer that is provided on the first surface of the semiconductor chip so as to avoid at least a part of the first electrode;
a second resin layer that is formed on the second surface of the semiconductor chip;
a wiring that extends from the first electrode to the first resin layer, a first portion of the wiring being disposed on at least a part of the first resin layer, the first portion of the wiring having a width narrower than a width of the first electrode in a direction parallel to the first surface of the semiconductor chip; and
a second electrode that is formed on the wiring, the second electrode being formed above the first resin layer.

* * * * *